United States Patent
Simic-Glavaski

(10) Patent No.: US 6,937,379 B2
(45) Date of Patent: Aug. 30, 2005

(54) MOLECULAR ARCHITECTURE FOR MOLECULAR ELECTRO-OPTICAL TRANSISTOR AND SWITCH

(76) Inventor: Branimir Simic-Glavaski, 2481 Edgehill Rd., Cleveland Heights, OH (US) 44106

( * ) Notice: Subject to any disclaimer, the term of this patent is extended or adjusted under 35 U.S.C. 154(b) by 87 days.

(21) Appl. No.: 10/014,659

(22) Filed: Dec. 11, 2001

(65) Prior Publication Data

US 2002/0071168 A1 Jun. 13, 2002

Related U.S. Application Data

(60) Provisional application No. 60/254,667, filed on Dec. 11, 2000.

(51) Int. Cl.$^7$ .............................. G02F 1/03; G11C 11/00
(52) U.S. Cl. ........................ 359/245; 359/243; 365/151
(58) Field of Search ................................ 359/241–245, 359/321; 365/151, 64; 257/2

(56) References Cited

U.S. PATENT DOCUMENTS

| | | | |
|---|---|---|---|
| 2,661,330 A | 12/1953 | Sullivan | ...................... 205/683 |
| 2,837,473 A | 6/1958 | MacCormak et al. | ....... 205/705 |
| 3,119,099 A | 1/1964 | Biernat | ........................ 365/151 |

(Continued)

FOREIGN PATENT DOCUMENTS

| | | |
|---|---|---|
| CA | 1258313 | 8/1989 |
| EP | 0 141 524 | 9/1984 |
| GB | 1412230 | 10/1975 |
| GB | 1543097 | 3/1979 |
| WO | WO 87/01807 | 3/1987 |
| WO | WO 01/51188 A2 | 7/2001 |

OTHER PUBLICATIONS

Jeanmaire et al., "Resonance Raman Spectroelectrochemistry 2," J. American Chem. Soc., vol. 98, No. 14, p. 4029, Jul. 1976.

Jeanmaire et al., "Resonance Raman Spectroelectrochemistry 3," J. American Chem. Soc., vol. 98, No. 14, p. 4034, Jul. 1976.

Friedman et al., "Approximate Selection Rules for Resonance Raman Spectroscopy," J. American Chem. Soc., p. 4043, Jul. 1976.

(Continued)

*Primary Examiner*—Georgia Epps
*Assistant Examiner*—M. Hasan
(74) *Attorney, Agent, or Firm*—Renner, Otto, Boisselle & Sklar, LLP

(57) ABSTRACT

Observable changes in electrical and optical characteristics of individual molecules adsorbed on a conductor or semiconductor caused by electrical and/or optical excitation or de-excitation of electrons within such molecules can be used as signals which in turn can be used to carry information and such observable information carrying changes or signals can be switched, amplified, and modulated by varying optical as well as electrical inputs to such molecules. Molecular structural design alters functional behavior of the molecular/quantum devices. In an example, monomeric metallated phthalocyanine behaves as a fast ($<10^{-12}$ second), energy efficient (3OkT/bit of information), fully reversible quantum switch with multiple outputs. However, if monomeric phthalocyanines are organized in structural combinations such as one dimensional wire-like ring-stacked, or two dimensional sheet-like ring-fused phthalocyanines, their electro-optical properties are significantly altered. As a consequence, their functionality behaves with properties that can replace a multiplicity of CMOS and similar classic semiconductor devices.

16 Claims, 12 Drawing Sheets

U.S. PATENT DOCUMENTS

| | | | |
|---|---|---|---|
| 3,183,359 A | 5/1965 | White | 359/305 |
| 3,200,057 A | 8/1965 | Burnside et al. | 204/507 |
| 3,313,938 A | 4/1967 | Peters | 359/247 |
| 3,431,437 A | 3/1969 | Kosonocky | 372/8 |
| 3,462,712 A | 8/1969 | Boddy et al. | 359/263 |
| 3,720,589 A | 3/1973 | Masunaga et al. | 205/235 |
| 3,833,894 A | 9/1974 | Aviram et al. | 365/151 |
| 3,906,241 A | 9/1975 | Thompson | 250/227.11 |
| 3,983,542 A | 9/1976 | Ovshinsky | 365/113 |
| 3,999,122 A | 12/1976 | Winstel et al. | 324/71.1 |
| 4,032,901 A | 6/1977 | Levinthal | 365/118 |
| 4,131,517 A | 12/1978 | Mitsuo et al. | 205/152 |
| 4,139,348 A | 2/1979 | Swartz | 436/35 |
| 4,164,431 A | 8/1979 | Tang | 257/40 |
| 4,169,022 A | 9/1979 | Ward et al. | 205/319 |
| 4,195,930 A | 4/1980 | Delhaye et al. | 356/301 |
| 4,213,839 A | 7/1980 | Azzerri et al. | 714/718 |
| 4,305,390 A | 12/1981 | Swartz | 435/173 |
| 4,334,880 A | 6/1982 | Malmros | 435/7.4 |
| 4,350,660 A | 9/1982 | Robinson et al. | 338/34 |
| 4,360,703 A | 11/1982 | Bolton et al. | 257/40 |
| 4,371,883 A | 2/1983 | Potember et al. | 257/1 |
| 4,402,062 A | 8/1983 | Batchelder | 365/301 |
| 4,428,744 A | 1/1984 | Edelson | 422/44 |
| 4,444,892 A | 4/1984 | Malmros | 324/71.5 |
| 4,471,470 A | 9/1984 | Swainson et al. | 365/127 |
| 4,479,199 A | 10/1984 | Friedlander et al. | 365/119 |
| 4,560,534 A | 12/1985 | Kung et al. | 422/98 |
| 4,574,366 A | 3/1986 | Potember et al. | 365/153 |
| 4,622,170 A | 11/1986 | Wynne et al. | 252/500 |
| 4,740,984 A | 4/1988 | Barrett | 372/70 |
| 4,804,930 A | 2/1989 | Simic-Glavaski | 359/276 |
| 4,855,243 A | 8/1989 | Simic-Glavaski | 436/63 |
| 4,903,272 A | 2/1990 | Simic-Glavaski | 372/3 |
| 5,202,786 A | 4/1993 | Boyle et al. | 359/243 |
| 5,327,373 A | 7/1994 | Liu et al. | 365/112 |
| 6,272,038 B1 * | 8/2001 | Clausen et al. | 365/151 |
| 6,324,091 B1 * | 11/2001 | Gryko et al. | 365/151 |

OTHER PUBLICATIONS

G. Hagen, "The Raman Spectrum of an Absorbed Species on Electrode Surface," J. Electroanal. Chem. 88, pp. 269–275, 1978.

B. Z. Nikolic et al., "Reflectance Spectra of Monolayers of Tetrasultonated Transition Metal Phthalocyanines Absorbed on Electrode Surfaces," J. Electroanal. Chem., 103, pp. 281–287, 1979.

J. G. Gordon II and J. D. Swalen, "Electrochromic Attenuated Total Reflection Modulator," IBM Technical Distribution Bulletin vol. 22, No. 5., p. 2074, Oct. 1979.

R. K. Chang, et al., "Enhanced Raman Scattering of Molecules Absorbed on Ag, Cu and Au Surfaces," Lasers and Applications, Proceedings of the Sergio Porto Memorial Symposium, Jun. 29–Jul. 3, 1980.

A. Owyoung and P. Esherick, "Inverse Raman Spectroscopy," Lasers and Applications, Proceedings of the Sergio Porto Memorial Symposium, Jun. 29–Jul. 3, 1980.

R. Kotz and E. Yeager, "Raman Spectroscopy of Cobalt Phthalocyanine Absorbed on a Silver Electrode," J. Electroanal. Chem., 113, pp. 113–125, 1980.

P. F. Liao, "Enhanced Raman Scattering with Ag Structures Produced by Micolithography," IEEE Journal of Quantum Electronics, vol. QE–17 No. 12, p. 105, 1981.

B. Simic-Glavaski, "Study of Phythalocyanines in Aqueous Solutions and Adsorbed on Electrode Surfaces," J. Electroanal. Chem., 150, pp. 469–179, 1983.

J. Lyman, "Quartz Laminate Suits Chip–carrier Boards," Electronics, vol. 55, No. 15, Jul. 28, 1982.

K. Connolly, "Light, Electric Pulses Switch Organic Films," Electronics, vol. 55, No. 15, Jul. 28, 1982.

E. F. Hilinski & P. M. Rentzepis, "Biological Applications of Picosecond Spectroscopy," Review Article, Nature, vol. 302, pp. 481–487, Apr. 7, 1983.

B. Simic–Glavaski, "Fast Optical Signals and Their Electrical Modulation from the Absorbed Tetrasulfonated Phthalocyanines," 1983.

B. Simic–Glavaski, "Spectroscopic and Electochemical Studies of Transition Metal Tetrasulfonated Phthalocyanines," 1983.

"Why IBM Gave up on Josephson Junction," Businessweek, Nov. 21, 1983.

B. Simic–Glavaski, "Spectroscopic Studies of Nerves," Nonlinear Electrodynamics in Biological Systems, pp. 519–530, 1984.

R. S. Potember, "Optical Switching in Semiconductor Organic Thin Films," vol. 41, No. 6, Sep. 1982.

A. Moretti, et al., "Surface–Enhanced Brillouin Scattering on Silver Films," The American Physical Society, vol. 31, No. 6, 1985.

B. Simic–Galvaski, Electrically Modulated Signals from Modular Devices, First International IEEE VLSI Multilevel Interconnection Conference, Jun. 21–22, 1984.

B. Simic–Galvaski, "Electrooptical Behavoir of Heme–Like Molecules Absorbed on Nerve Membrane," Apr. 2, 1985.

"Birth of the Maser and Laser," Nature, vol. 316, pp 307–309, Jul. 25, 1985.

J. F. Holzrichter, "High–Power Solid–State Lasers," Nature, vol. 316, pp 309–314, Jul. 25, 1985.

M. H. Key, "Laboratory Production of X–Ray Lasers," Nature, vol. 316, pp 314–319, Jul. 25, 1985.

S. D. Smith, "Lasers, Nonlinear Optics and Optical Computers," Nature, vol. 316, pp 319–324, Jul. 25, 1985.

V. S. Letokhov, "Laser Biology and Medicine," Nature, vol. 316, pp 324–330, Jul. 25, 1985.

X. Zhou, et al., "Direct Imaging of the Lattice in Poly (Phthalocyaninato–Germoxane) Single Crystals," Mol. Cryst. Liq. Cryst, vol. 118, pp. 357–160, 1985.

T. Inabe, et al., "Phthalocyanine–Based Electrically Conductive, Processible Molecular/Macromolecular Hybrid Materials," Synthetic Metals, vol. 13, pp. 219–229, 1986.

R. S. Potember, et al., "Reversible Electric Field Induced Bistability in Carbon Based Radical–Ion Semiconducting Complexes: A model System for Molecular Information Processing and Storage," 1987.

R. M. Hazen, "Perovskites," Scientific America, pp. 74–81, Jun. 1988.

N. Baran, "Breakthrough in Holographic Memory Could Transform Data Access," Byte, p. 20, Jan. 1991.

"Semiconductor Lasers," Textbook, pp. 228–261 (no date).

A. Noldechen, "Biochips: die Zukunft im Visier," Electronik, p. 65, Jun. 13, 1985.

M. Moskovitz, "Enhanced Raman Scattering by Molecules Adsorbed on Electrodes," Conference Paper, p. 59, Oct. 1979 Copy Not Available.

Eesly et al. "Enhanced Raman Scattering," 9/79, pp. 815–819, Solid State . . . , vol. 150 (1–2) Copy Not Available.

* cited by examiner

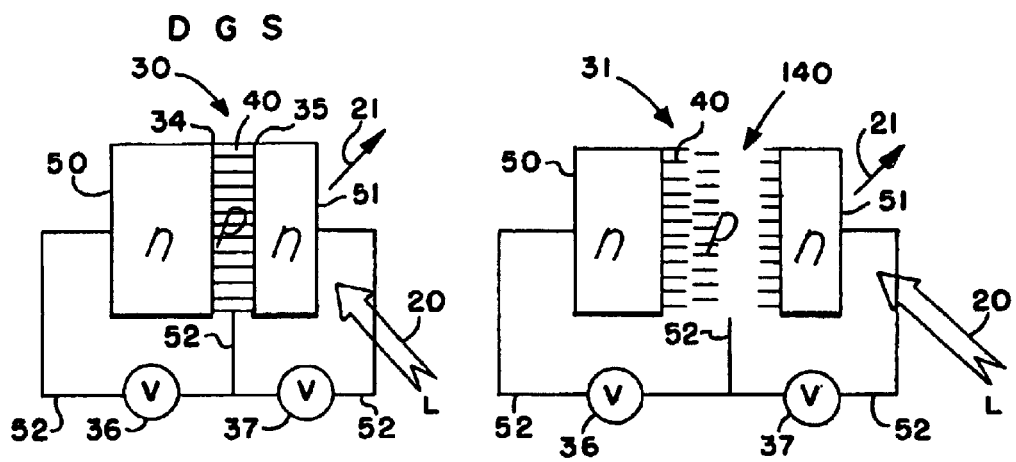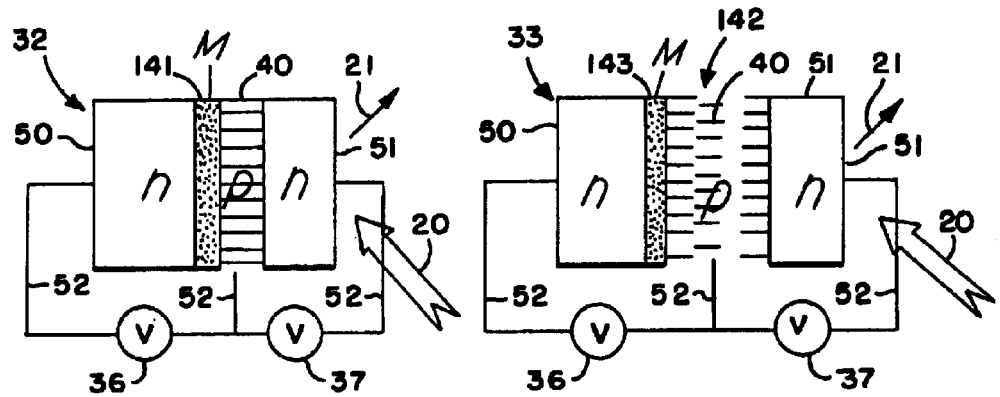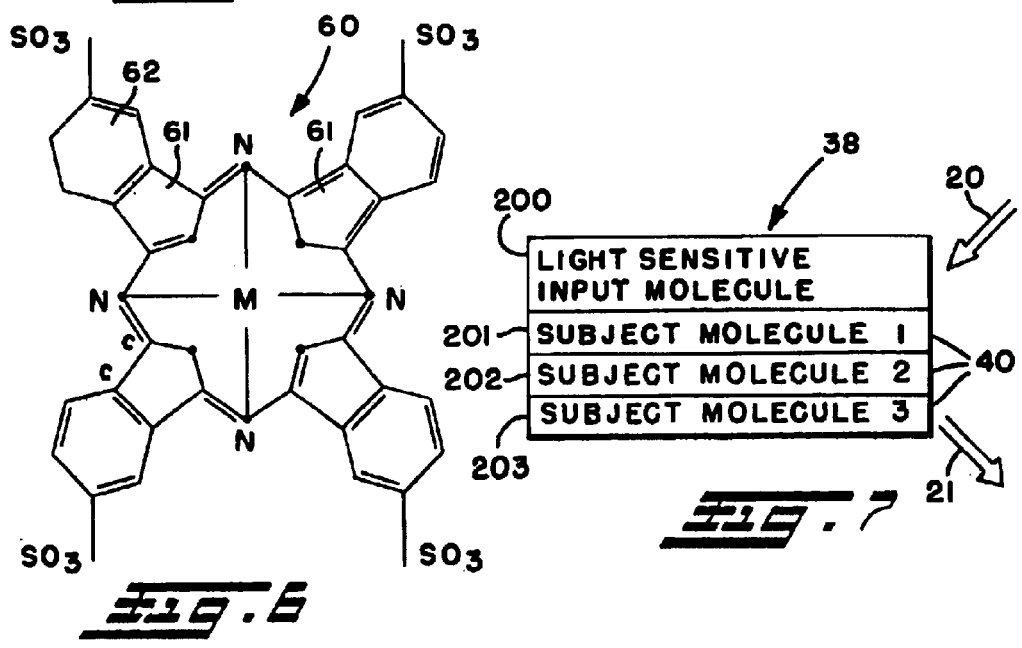

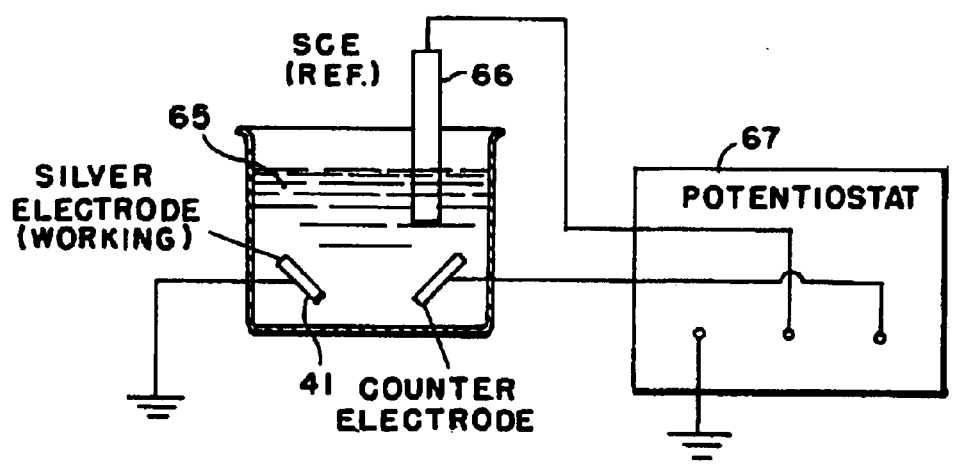
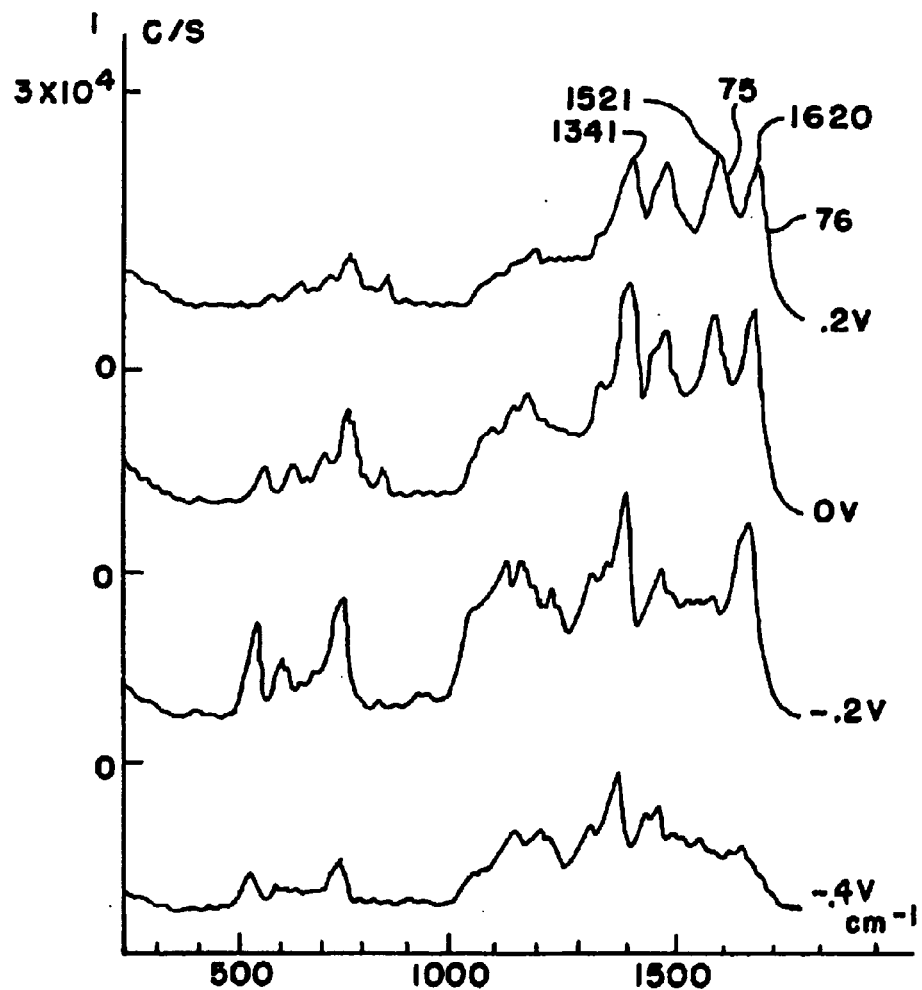

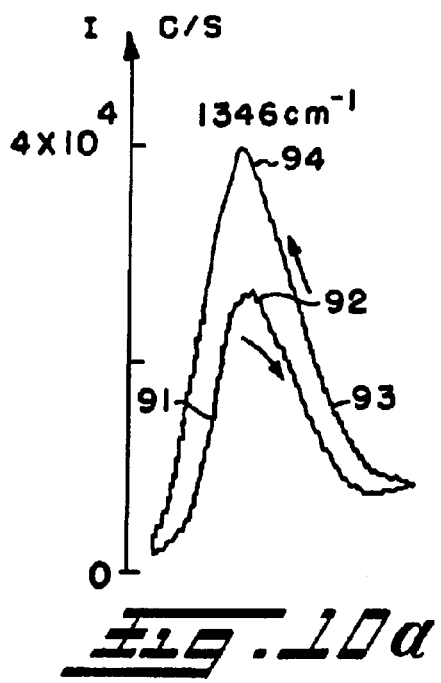
_FIG.10a_
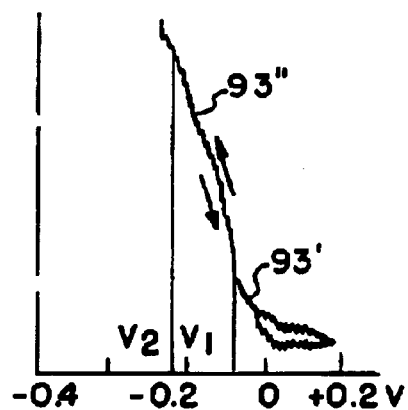
_FIG.10b_
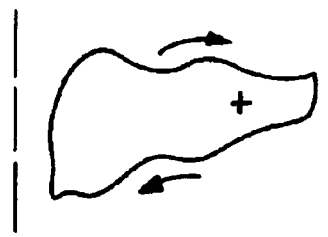
_FIG.10c_

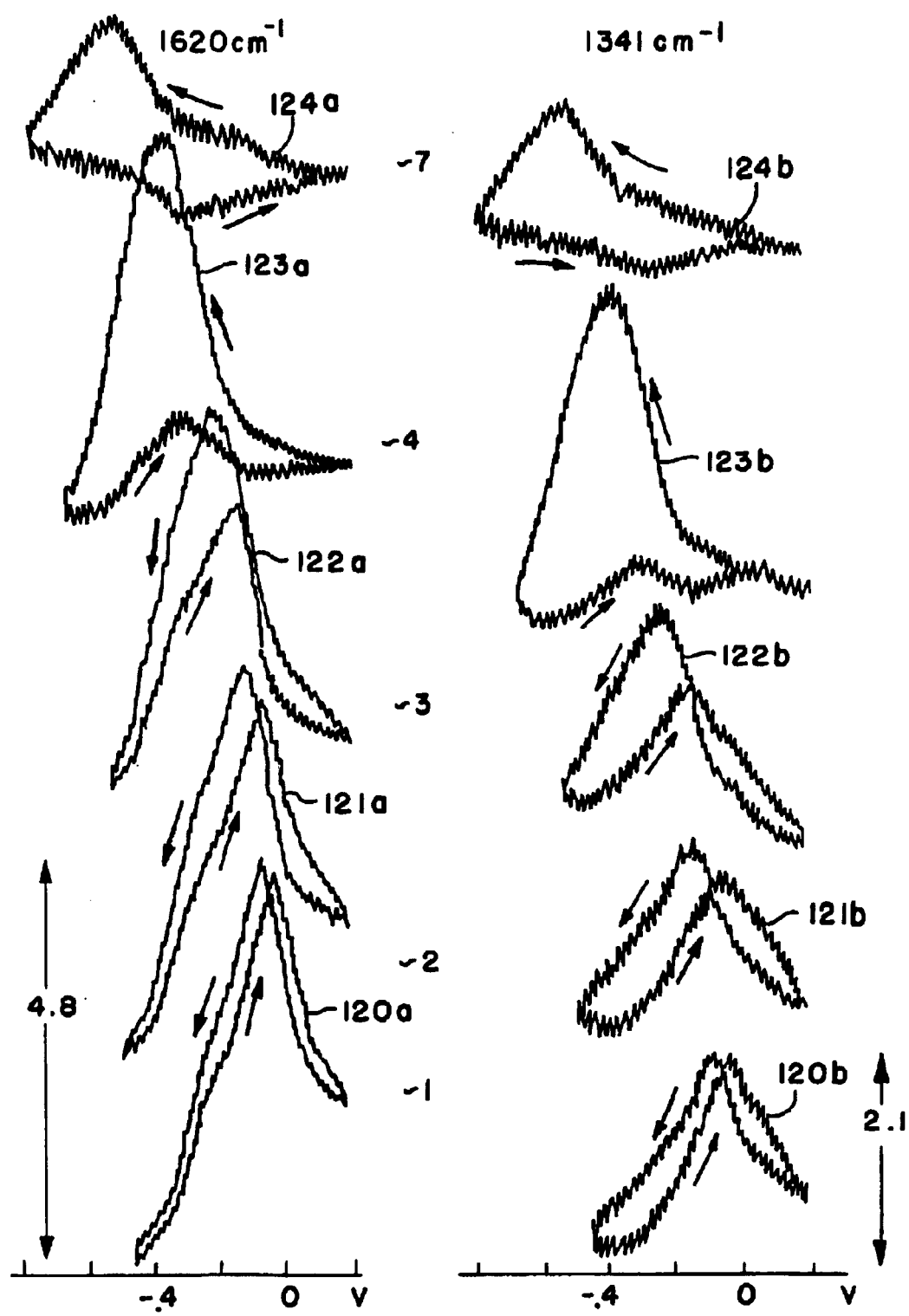

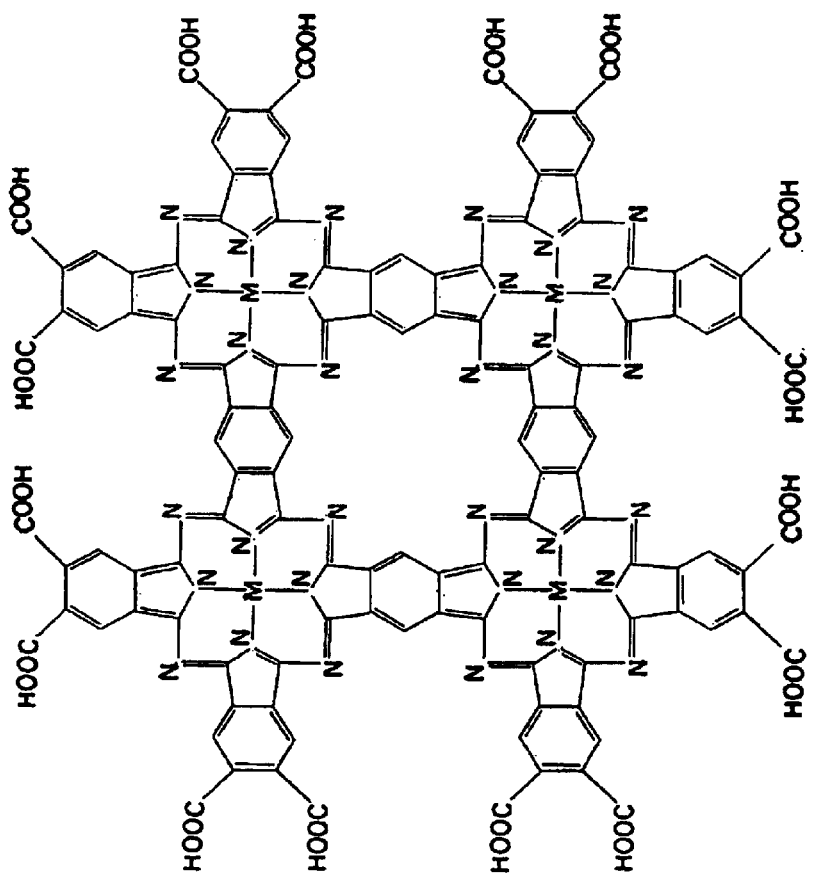
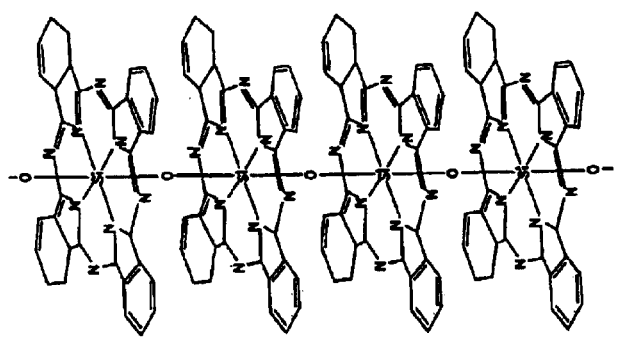
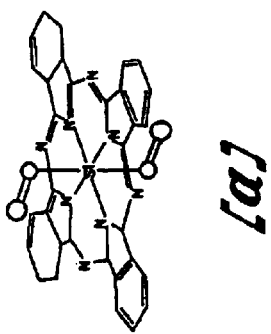
FIG. 7

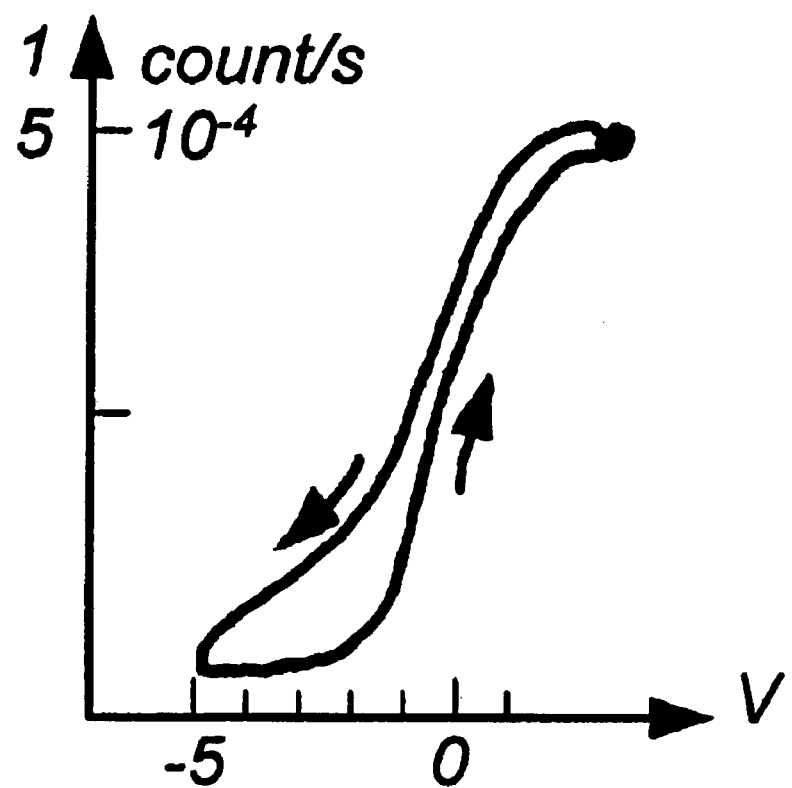
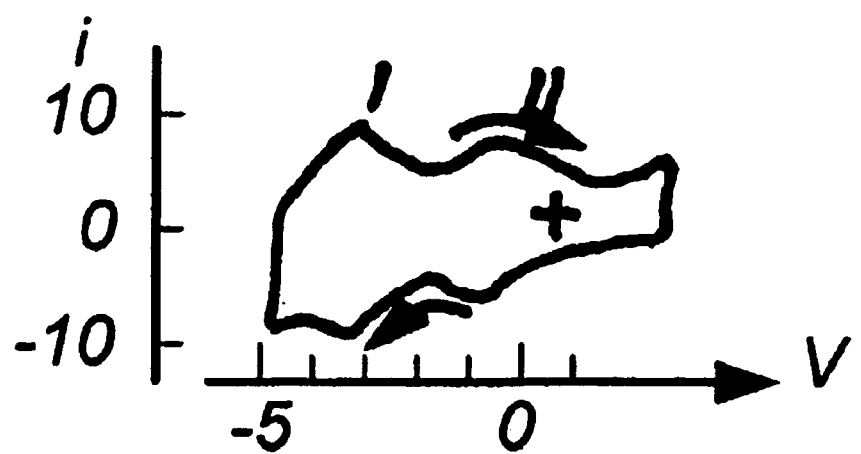
FIG. 17

MOLECULAR ARCHITECTURE FOR MOLECULAR ELECTRO-OPTICAL TRANSISTOR AND SWITCH

Priority is claimed under 35 U.S.C. §119(e) from U.S. provisional patent application No. 60/254,667, filed Dec. 11, 2001

TECHNICAL FIELD

This invention relates generally, as indicated, to molecular electronic and optical devices, and, more particularly, to molecular architecture therefor.

BACKGROUND

In the past signals were derived from a large number of molecules making up a material on a so-called macro level, an example being the transistor. Now, according to the present invention, signals are derived from changes in state in a single molecule. These individual states can be read out or analyzed by vibrational spectroscopy techniques, for example, Raman spectroscopy techniques, or perhaps by other optical analysis techniques. In order to resolve the signal spatially and in intensity Raman spectroscopy is preferred.

Typical response times for conventional electrical devices, e.g. to accomplish a switching function, have been on the order of $10^{-9}$ or $10^{-10}$ second. Various techniques for still more quickly switching signals and information have been developed, such as the Josephson junction. A disadvantage to such fast-acting electrical switches or switch junctions has been the extreme temperature requirements. For example, a Josephson junction type of fast-acting electrical switch must be very cold, e.g. super cooled. Typically liquid helium is used to maintain the switching junction at the desired cold temperature for proper operation. The cost and space requirements to maintain such temperature conditions are counter-productive to the goals of cost reduction and miniaturization, which are highly sought in the computer field, for example.

As is demonstrated in U.S. Pat. No. 4,804,930, phthalocyanine molecules as molecular monomeric units or in general electrochemically semi-organized forms, can provide a variety of electro-optical properties. Fast switching effect, multilevel logic, memory states are experimentally well documented in the above patent and other publications.

As is disclosed in U.S. Pat. No. 4,04,930, the inventor has discovered that the observable changes in the electrical and optical characteristics of individual molecules caused by the electrical and/or optical excitation or de-excitation of electrons within such molecules can be used as signals which in turn can be used to carry information and that such observable information carrying changes or signals can be switched, amplified, and modulated by varying the optical as well as the electrical inputs to such molecules.

In the invention electro-optical molecules are adsorbed on a substrate. The natural characteristic of such a molecule is altered by ionization or electron transfer; more specifically an electron is excited to an excited state. Electron transfer, trapping, or excitation/state change, or molecule ionization is effected and controlled as a function of (1) electric potential across an adsorbed molecule or a layer or layers of such molecules and/or (2) wavelength(s)/frequency(ies) and intensity(ies) of the incident illumination thereof. Such electron transfer, trapping, or state change causes a change in the natural or non-perturbed optical response of the adsorbed molecule. Thus, state and state change as they are used herein refer to electron location within a molecule, energy level of such electron, and/or spin state of such electron. The optical response can be detected using Raman spectroscopy, preferably surface enhanced Raman spectroscopy. Such detection or analysis provides a spatial distribution of the Raman lines, each having a particular intensity or magnitude level. Analysis of the frequency or spatial distribution as well as the intensity of such output signal(s) or information identifies where such electron is trapped or transferred in the adsorbed molecule.

The frequency or spatial distribution of such output signal, therefore, is a function of the location in the molecule at which the electron is trapped or transferred; i.e. which electron has had a state change. Such state change or trapping may be referred to equivalently herein. Such trapping or electron excitation affects the natural vibrational characteristics of molecular bonds of the adsorbed molecule. Indeed, for example, in response to a particular electrical potential applied to adsorbed molecules and a particular optical input to such molecules, the natural vibrational state of one of the molecular bonds of such molecule may be altered to emit an optical or light output having a characteristic frequency or Raman spatial distribution that can be detected and analyzed and used for signaling or informational purposes. Using Raman spectroscopy input laser light of a given frequency will beat with the frequency of vibration of a particular band to cause re-emission of light from the molecule, and such re-emitted light or scattered light then has a spectral component that is related to such vibrational characteristic of the bond. Thus, excitation of an electron in a molecule to distort and, therefore, to change the vibrational character of a bond therein will affect the optical output from the molecule.

Since the invention takes advantage of light that is emitted in response to intramolecular electron excitation mechanisms, the response of the optical output signals is limited by the lifetimes of the vibrational excited states, for example on the order of about $2\times10^{-13}$ second. Response times on the order of $10^{-5}$ second are expected to be observed for molecules that exhibit tunneling. Moreover, it has been discovered that such extremely fast response is achievable at typical room ambient temperatures without requiring super cooling, such as that needed for Josephson junction technology. Such response may be detected, e.g. by a light sensor, thereby to provide fast switching, read-out, etc. functions.

The invention may be used to obtain from the output light emitted by the molecule(s) one or more distinct output signals, each of which may be at different intensity levels. Such signals are distinguished from each other in the frequency or energy domain. Single or multiple signal outputs from the overall system is possible. The Raman spectrum line from a distinct frequency then would represent a specific output signal or information which could be used in multilevel fashion, such as multilevel logic, etc. The existence of such a line and the intensity thereof can be used as or can be used to derive output information that is based on intramolecular electron distribution within the said molecule. Thus, for example, for such multisignal output use, while maintaining a constant incident illumination of the adsorbed molecules, changing the applied potential may cause various ones of the Raman spectrum output lines to vary respectively in intensity; such variations need not necessarily be the same for each line. For single output, while maintaining a constant incident illumination of the adsorbed molecules, as will be described in greater detail below, variation of the potential across the adsorbed molecules can effect a modulation of the Raman signal. Conversely, a similar effect on the output may be achieved by changing the intensity and/or wavelength(s)/frequency (ies) of the incident illumination while maintaining constant the applied electric potential and incident illumination.

The invention envisions the realization that a molecular size device can be used to derive an output that can be treated as a signal for carrying information and such signals can be modulated at very high speeds. Exemplary speeds may be on the order of from about $10^{-13}$ to about $10^{-15}$ second. To accomplish that purpose the invention achieves an operative system by selecting a molecular species and means for applying thereto the electrical and optical inputs to obtain detectable outputs.

Preferred molecules would be macrocyclics, such as various metallated phthalocyanines, porphyrines, chlorophyls, hemes, or cytochromes. However, other molecules may be used according to the invention if they respond to the desired input to achieve an excited state that can produce a useful detectable output. For some applications of the invention the molecules, and preferably macrocyclics, should exhibit semiconductor properties.

To apply electric potential to or to obtain electric polarization of the molecules, the molecules should be adsorbed on a conducting or semiconducting substrate. Preferable conducting substrates would be, for example, silver, gold, platinum, palladium, silver bromide, silver iodide, copper, and aluminum, and halides of these metals; the most preferred would be silver and silver halides. Preferred doped or non-doped semiconductor substrates would be, for example, galium arsenide, tin oxide, zinc oxide, silver oxide, cadmium sulfate, germanium. Organic material exhibiting similar characteristics also may be used as the substrate that can provide charge transfer from higher energy states to the lower energy states of the adsorbed molecule.

Optical input may be provided by a monochromatic light source, such as one or more lasers. However, a non-monochromatic light source may be used if a light sensitive molecular species, such as rhodopsin, is attached as a polar group to or will otherwise form a chemical bond with the subject molecule to function as an input molecule therefore. In such case the electrons in the light sensitive input molecular species are excited by the light input, and this excitation is transferred to the subject molecule. This configuration makes more efficient use of the input light and permits amplification of the emitted optical signal. Using such light sensitive input device the invention may be characterized as an optical to optical valve, which may be considered analogous to other types of mechanical and electrical valves, the latter for example including electron tubes, transistors, other semi-conductor devices, and the like. Moreover, using such rhodopsin or other similar or dissimilar input and output devices may facilitate providing inputs to the subject molecules and obtaining useful outputs therefrom, for example without direct wire or fiber optics attachment, etc., thereto.

The invention may be characterized as a switch, an amplitude modulator, and/or an amplifier. As a switch the invention responds to an input to turn on or off a particular output, and this occurs at high speed, e.g. speeds on the order of $10^{-13}$ to $10^{-15}$ second. As an amplitude modulator the invention responds to an input to modulate the amplitude of an output, e.g. the intensity of light of a particular frequency, and this, too, can occur at the mentioned high speeds. As an amplifier the invention responds to an input, for example light, to produce an amplified output. The invention is described in detail with reference primarily to the producing of an optical output; however, the invention also may be used to produce electrical output. In one embodiment of the invention the adsorbed molecules are on an electrode surface. The electrode and molecules are placed in an electrolyte, such as a liquid bath. Illumination is by a monochromatic optical source, preferably a laser. Potential from an electrical source is applied to the adsorbed molecules between the electrode and the electrolyte, which serves as the other electrode.

In another embodiment the molecules are of the macrocyclic type, for example, phthalocyanines, porphyrines, chlorophyls, hemes, or cytochromes, that have characteristics of doped semi-conductor materials; and such molecules may be used with other semi-conductor materials, such as conventional doped materials. Such semi-conductor materials provide the needed potential application to the adsorbed molecules to cause the overall structure to have operational characteristics of, for example, a transistor. Such macrocyclics exhibit p type semi-conductor properties and also are photoactive. Therefore, for such transistor to be complete, the other material used at the opposite sides of the p type material should be n type semi-conductor material. Another solid state semi-conductor type device in which the invention may be used is a diode and it is contemplated that other type semi-conductor devices also may employ the invention. The semi-conductor devices according to the invention may be used in conventional ways, e.g. relying on transistor action for an amplifier or switch, etc. Still another solid state semi-conductor device in which the invention may be used is a field effect transistor (FET).

SUMMARY

Briefly, according to an aspect of the invention, molecular structural design alters functional behavior of the molecular/quantum devices. In an example, monomeric metallized phthalocyanine behaves as a fast ($<10^{-12}$ second), energy efficient (3OkT/bit of information), fully reversible quantum switch with multiple outputs. However, if monomeric phthalocyanines are organized in structural combinations such as one dimensional wire-like ring-stacked, or two dimensional sheet-like ring-fused phthalocyanines, their electro-optical properties are significantly altered. As a consequence, their functionality behaves with new remarkable properties that can replace a multiplicity of CMOS and similar classic semiconductor devices.

An aspect of the present invention relates to electrical modulation of an optical output signal or information. Another aspect relates to optically modulating an optical output signal or information. Yet another aspect is to achieve a signal amplification effect. An additional aspect relates to the optical modulation of an electrical signal or information. A further aspect relates to switching signals or information at high speed, and still another aspect is the miniaturization of such switching apparatus. Yet a further aspect is to combine two or more of such aspects or features in a single device. Such features of the invention may be utilized, for example, in computers for switching, memory, input, output and/or other functions; and such features also may be otherwise used, for example, in electrical, optical and/or other systems and devices.

An aspect of the invention relates to a switching device including a macrocyclic molecule arrangement in at least one of a substantially one dimensional stack arrangement or a two dimensional arrangement, said arrangement being adsorbed on a substrate.

Another aspect relates to a memory device including a macrocyclic molecule arrangement in at least one of a substantially one dimensional stack arrangement or a two dimensional arrangement, said arrangement being adsorbed on a substrate.

Another aspect relates to an information storage and retrieval apparatus including a memory device including a macrocyclic molecule arrangement in at least one of a substantially one dimensional stack arrangement or a two dimensional arrangement, said arrangement being adsorbed on a substrate, an input to apply optical or electrical input, and a detector to detect the output or response from the memory device.

Another aspect relates to a method of obtaining multiple outputs from a switching device, including applying an input to an arrangement of macrocyclic molecules in at least of a substantially one dimensional stack-like or ring-like structure or a substantially two dimensional sheet-like structure, and responding to multiple outputs.

Another aspect relates to a molecular/quantum device, including a monomeric metallated phthalocyanine that behaves as a fast ($<10^{-12}$ second), energy efficient (3OkT/bit of information), fully reversible quantum switch with multiple outputs, wherein the monomeric phthalocyanines are organized in structural combinations of at least one of one dimensional wire-like ring-stacked, or two dimensional sheet-like ring-fused phthalocyanines.

Another aspect relates to a method of making a molecular/quantum device, including a monomeric metallated phthalocyanine that behaves as a fast, energy efficient, fully reversible quantum switch with multiple outputs, wherein the monomeric phthalocyanines are organized in structural combinations of at least one of one dimensional wire-like ring-stacked, or two dimensional sheet-like ring-fused phthalocyanines, including tailoring number of peaks in a cyclic voltammogram representation of operation of the device according to the number of stacked rings in the "wire."

Another aspect relates to a method of making a quantum electro-optical device, comprising arranging a plurality of macrocyclic molecules in a substantially one dimensional ring-like stace or in a substantially two dimensional sheet-like arrangement, and adsorbing the same to a conductor or semiconductor substrate.

Exemplary uses of the invention include optical modulators in which optical output signals are modulated by an electrical input or by an optical input; optically responsive diode in which electrical signals are modulated in response to an optical input; optically responsive transistors; and amplifiers. The invention may be used as a memory type device, such as a dynamic random access memory (DRAM), for example, for a computer or a computer type system, as a fast switch, or as a pulse shaper. The invention provides for fast optical readout of electrical signals and/or electrical readout of or response to optical signals.

The invention is described herein as responding to and outputting light. Such light preferably is in the visible spectrum; however, it is contemplated that electromagnetic radiation, e.g. light, outside the visible spectrum also may be employed depending, for example, on the materials used, the sensitivities thereof, etc. The words light, illumination, radiation and equivalents may be used equivalently herein.

Various objects and advantages of the present invention will become apparent from the description herein.

To the accomplishment of the foregoing and related ends, the invention, then, comprises the features hereinafter fully described in the specification and particularly pointed out in the claims, the following description and the annexed drawings setting forth in detail certain illustrative embodiments of the invention, these being indicative, however, of but several of the various ways in which the principles of the invention may be employed.

BRIEF DESCRIPTION OF THE DRAWINGS.

In the annexed drawings:

FIG. 1 is a schematic illustration of an electro-optical switch system in accordance with the present invention utilizing a liquid electrolyte;

FIGS. 2 through 5 schematically illustrate several versions of electro-optical transistors in accordance with a modified embodiment of the invention;

FIG. 7 is a schematic representation of an assemblage of a light sensitive input molecule and plural macrocyclic phthalocyanine molecules operatively interactive to function as a light amplifier;

FIG. 8 is a schematic illustration of a system for activating a silver electrode and for adsorbing molecules thereon;

FIG. 9 is a graphical representation of the Raman spectra measured at respective electric potentials across the macrocyclic monolayer, for example using the system illustrated in FIG. 1;

FIG. 10*a* is a volt-Raman graph for the 1346 cm.sup.−1 Raman band, such graph having substantial bistable hysteresis; FIG. 10*b* is a graphical representation like that of FIG. 10*a* taken over a more limited voltage range to reduce bistable hysteresis; and FIG. 10*c* is a cyclic voltammogram obtained from the same material examined and producing the output illustrated in FIGS. 10*a* and 10*b*;

FIGS. 11*a*, 11*b*, and 11*c* are volt-Raman graphs for three Raman bands at different respective pH levels of the electrolyte, for example measured according to the system illustrated in FIG. 1.

FIGS. 14 are schematic representations of different phthalocyanine structures, representing (a) monomer, (b) ring stacked "linear" arranged (e.g., primarily one dimensional structure), and (c) polymer sheet (e.g., primarily two dimensional planar structure);

FIG. 17 is a group of curves representing the pulse code firing rate of a neuron represented as a variation of the intensity of a Raman line obtained from Fe-TsPc adsorbed on a silver electrode, the upper curve illustrating electro-optical properties and the lower curve representing current vs. electrical potential;

DESCRIPTION

Figure 6:
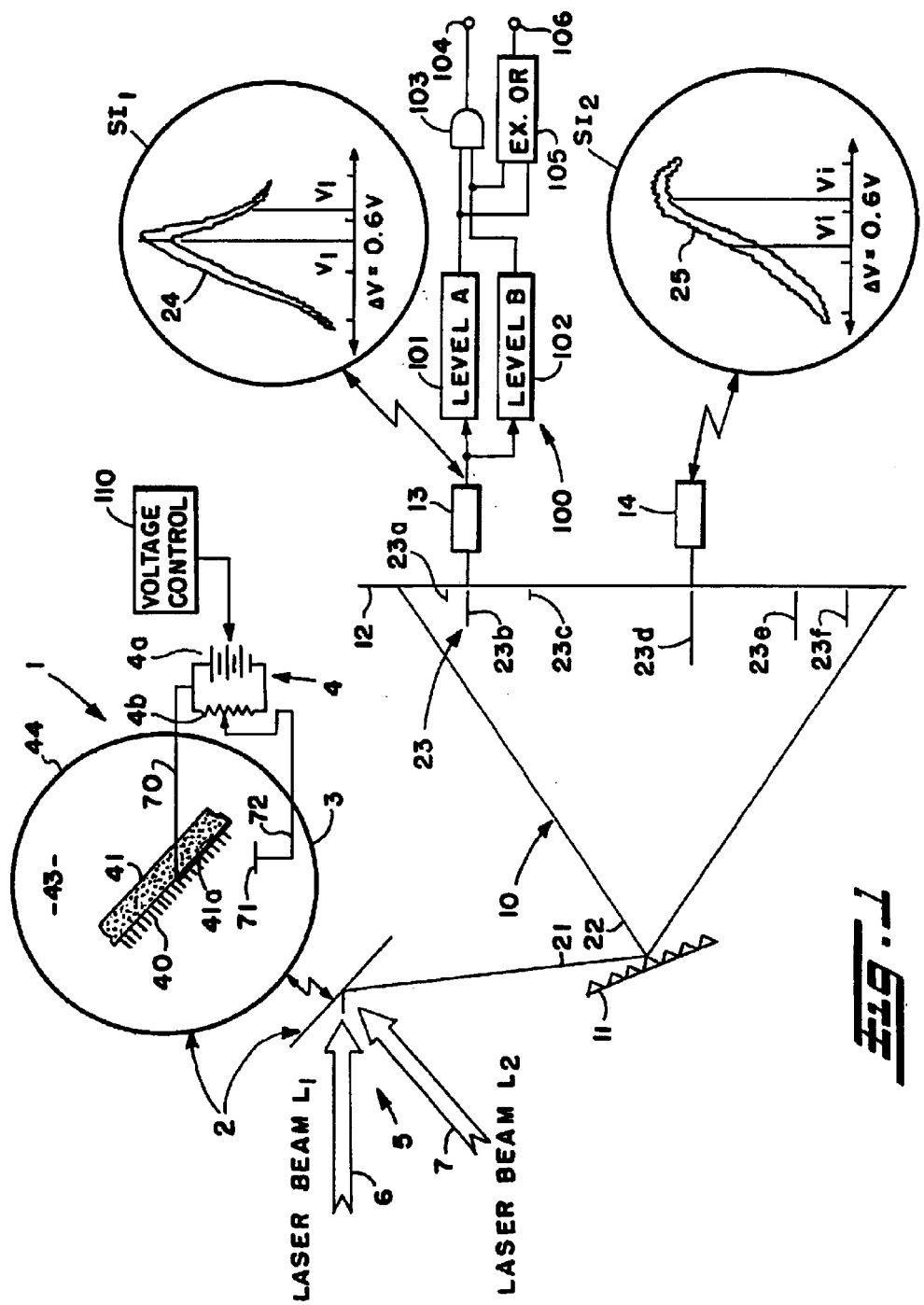
FIG. 6 is a schematic illustration of a macrocyclic molecule in the form of tetrasulfonated phthalocyanine, which may be employed in accordance with the present invention as an adsorbed monolayer on an electrode or semi-conductor substrate.

Referring now in detail to the drawings, wherein like references numerals designate like parts in the several figures, and initially to FIG. 1, an electro-optical system in accordance with the present invention generally is indicated at 1. In the system 1 there is illustrated a molecular electro-optical device schematically represented at 2. In FIG. 1 there is an enlarged illustration of one version of such device 2 in the form of a molecular electro-optical switch 3, which includes the subject molecules of the invention adsorbed on an electrode substrate. It will be appreciated, however, that the device 2 may be one of the molecular electro-optical solid state semi-conductor transistor type devices illustrated in FIGS. 2 through 5.

An electrical supply 4 is associated with the switch 3. In the preferred embodiments such electrical supply 4 may include a D.C. voltage source 4a and a variable resistor 4b type device, for example, to apply an electric potential across one or more layers of material employed in the switch 3. Automatic, electronic or other controls may be used to change such electric potential. An optical supply or input is represented schematically at 5 in FIG. 1. Such optical input 5 may include one of more sources of monochromatic optical radiation or light and most preferably is in the form of one or more laser beams 6, 7 from, for example, conventional laser devices. Although they are illustrated directed at different angles of incidence to the device 2, the laser beams 6, 7 are only schematically represented in FIG. 1.

A Raman spectrophotometer analyzer 10 is the remaining portion of the electro-optical system 1. The analyzer 10 includes a grating 11, which separates light received from the molecular electro-optical device 2 into its spatially distributed components, which are directed or projected, for example, onto a screen 12 or into a plane, for example, where they can be observed. Furthermore, the analyzer 10 includes one or more photosensitive detector devices, such as those shown at 13, 14, which may be, for example, photomultipliers, photosensitive diodes, or other device capable of producing a useful output, such as an electrical signal, representing intensity of light received thereby.

In operation of the electro-optical system 1, for example, incident illumination 20 is directed onto the molecular electro-optical device 2, such as the switch 3 described here or one of the transistors described below. Scattered or re-radiated light 21 from the device 2 is directed to the Raman spectrophotometer analyzer 10, which is used to analyze the intensity, wavelength, frequency, and/or spatial distribution of the components of such scattered or re-radiated light 21. The subject molecules of the invention are excitable in response to electrical and/or optical input thereto to change from a natural or unperturbed state to an excited one, and the level or extent of such excitation will depend, for example, on the electric potential (or other electric input) thereto or thereacross and/or the intensity and wavelength or frequency of light incident thereon. Such excitation causes ionization of the subject molecule(s) with the result that there appears to be an intramolecular charge transfer, trapping, or excitation to an excited state of an electron at a particular location in the molecule(s). The location of such trapping or excited electron, for example, may be a function of the input electric potential and/or light wavelength/frequency and/or intensity and may alter the natural vibrational characteristic of an intramolecular bond, which, accordingly, changes the optical characteristics of light emitted by the molecule(s). As used herein, then, reference to scattered, emitted, or re-emitted light from the subject molecules means that light emitted thereby in response to the electrical and/or optical exciting of the subject molecule(s). For a given wavelength, frequency, and intensity of incident illumination 20, the characteristics of the light analyzed by the analyzer 10 will be a function of the electric potential applied to the electro-optical switch 3 by the electrical supply 4. Moreover, for a constant electric potential applied to the switch 3 by the electrical supply 4, the characteristics of the light analyzed by the analyzer 10 also may be a function of the wavelength, frequency, and/or intensity of the incident illumination 20. Furthermore, an added dimension of the output, i.e. the information obtained by the analyzer 10, may be accomplished by varying both the incident illumination 20 and the electric potential provided by the electrical supply 4. Electric potential or other electrical characteristic of the device 2 also may be read out as a function of an optical and/or electrical input.

Preferably the analyzer 10 is a Raman spectrophotometer type to achieve a spatial distribution in the frequency domain of the scattered light as well as to measure the intensity thereof, particularly of the spectral components thereof. The operation of the Raman spectrophotometer, according to the invention, preferably is along the principles of surface enhanced Raman scattering. However, other optical analyzers could be used if capable of obtaining useful output from the re-radiated light 21, for example by analyzing the spatial distribution of the components thereof.

In the Raman spectrophotometer analyzer 10 the illustrated triangular envelope 22 represents the maximum extremities of the spatial distribution of the spectral components of the scattered or re-radiated light 21, for example. Within that envelope ordinarily would be a number of Raman spectrum lines, such as those depicted generally at 23 and particularly represented at 23a through 23f, for example, in FIG. 1. If the band pass on the monochromator of the spectrophotometer 10 for detector 13 is set to a relatively wide magnitude, such as 20 $cm^{-1}$ then the detector 13 can be used to produce an output curve in the form of a volt-Raman graph represented at 24 where the intensity of light monitored by the detector 13 is detected as a function of the electric potential applied by the electrical supply 4 to the molecular electro-optical switch 3. The graph 24 illustrates a certain bistable hysteresis characteristic, which will be discussed in greater detail below. A different volt-Raman graph 25 is shown for the detector 14 which is positioned with respect to the grating 11 and screen 12 to measure other Raman spectrum line area producing information representing intensity of light as a function of the electric potential applied by the electrical supply 4 to the molecular electro-optical switch 3.

The electro-optical system 1 is operative at typical room ambient temperatures of, for example, from about 20 degrees C to about more than about 300 degrees C; there is no requirement for super cooling like that needed for Josephson junction technology.

Using the electro-optical system 1 as a high speed switch device, for example, for a given electric potential applied to the molecular electro-optical switch 3, the turning on and off of the incident illumination 20 will result in correspondingly turning on or off the scattered or re-radiated light. Switching times as short as from about $2 \times 10^{-13}$ second to about $5 \times 10^{-13}$ second have been achieved at room ambient temperature.

In accordance with an alternate embodiment of the invention, a molecular electro-optical transistor semiconductor device, such as those illustrated at 30, 31, 32 and 33 in FIGS. 2 through 5, may be substituted for the molecular electro-optical switch 3 in the electro-optical system 1 of FIG. 1. Such a modified system 1 would function optically generally quite similarly, if not identically, to the system described above employing the molecular electro-optical switch 3. Electrically, though, such a modified system 1 employing such a transistor or other solid state semiconductor type device, could function somewhat differently than the switch 3. Briefly, such electrical operation would be of the conventional semi-conductor transistor type operation, for example, in which doped semi-conductor materials interact with respect to each other and, in particular, the electric potentials applied to such materials, most specifically to the junctions of such materials, enables a transistor type action. By appropriately biasing the respective junctions of differently doped materials, e.g. the respective pn junctions 34, 35, by the electrical supplies 36, 37 associated with the transistor 30 in FIG. 2, the ionization level of or the electric potential applied to the molecular electro-optical material 40, which is preferably a macrocyclic material, achieves appropriate changes in the intensity and/or spatial distribution of the Raman spectrum lines 23 (FIG. 1) analyzed from the scattered or re-radiated light 21.

In accordance with still another alternate embodiment of the invention, a molecular electro-optical amplifier type device or molecular structure may be substituted in either of the switch 3 or transistors 30–33. Such amplifier molecular structure 38 is shown in FIG. 7 including a phthalocyanine (or other macrocyclic) molecular portion and a light sensitive input molecule chemically bonded thereto. In response to the input of light to the input molecule, the same excites the macrocyclic portion, which effectively amplifies such excitation and, accordingly, produces an amplified light output.

Thus, the present invention encompasses the use of electro-optical responsive molecules in an electro-optical system as a switch and/or transistor or like devices to effect signal switching, signal modulation, and/or signal amplification. In the switch embodiment preferably electric potential is applied across the molecules via an electrode, preferably a metal electrode, such as a silver electrode, on which the molecules preferably are adsorbed, on the one hand, and a liquid electrolyte, on the other hand. If desired, a solid second electrode may be substituted for the electrolyte. In FIG. 1 such silver electrode is represented at 41; the molecules adsorbed on a surface of the electrode are represented at 40; and the electrolyte is represented at 43. The electrolyte 43 may be, for example, an acid, and, it as well as the electrode 41 with the molecules 40 adsorbed thereon, may be contained in an optically transparent container 44 such as a beaker or other preferably optically transparent container. Using the system of the invention as a transistor or other semiconductor molecular electro-optical device 2, the molecules 40 (FIG. 2) preferably are of the macrocyclic type that have electro-optical characteristics, such as phthalocyanines, porphyrines, chlorophyls, hemes and cytochromes, and such material also should have doped semi-conductor properties. The just-mentioned materials naturally have p type doping characteristics. Therefore, referring to FIG. 2, for example, the other semi-conductor material, such as that depicted at 50, 51, preferably has n type doping characteristics. Such doped semiconductor material 50, 51 together with the lead connection 52 provides for appropriate semi-conductor junction biasing and electric potential application/molecule ionization or excitation to effect the desired optical output response in the form of scattered or re-radiated light 21 by the molecules 40 in the transistor 30 in response to incident illumination 20.

It is noted here that the transistors 30–33 may be functional to respond to incident radiation thereby to change measurable output electrical characteristics of the transistor, as was mentioned above with respect to the molecular electro-optical switch 3. However, the detailed description of the invention will be directed primarily hereinafter to use of the electro-optical system I in accordance with the invention, either employing the switch 3 or one of the transistors 30–33, for example, to alter the optical output in response to the change in the input electric potential and/or incident illumination. The invention, nevertheless, is to be construed as encompassing the corollary of a change in measurable electrical characteristics in response, for example, to input electric potential and/or incident illumination or both.

In accordance with the preferred embodiment and best mode of the present invention, the molecules 40 are electro-optically active. Specifically, such molecules are active in a way that they re-emit light in response to incident radiation or illumination thereof. Moreover, preferably such re-emitted light has an intensity and spatial distribution of the spectral components thereof that vary as a function of incident illumination and/or electric potential applied to the molecules. More preferably, and especially when the electro-optically responsive molecules are employed in a transistor device, the same preferably have doped semiconductor properties, such as, for example, p type doped semi-conductor material, as is depicted in FIGS. 2–5 in the transistors 30–33. Such molecules also may be employed in the molecular electro-optical switch 3. Examples of the most preferred macrocyclic molecules are phthalocyanines, (sometimes abbreviated Pc), porphyrines (sometimes abbreviated P), chlorophyls, hemes, and cytochromes, all of which have the desired electro-optical characteristics and p type semi-conductor characteristics.

In one example water-soluble tetrasulfonated phthalocyanine was used as the electro-optical molecular material, and such material was adsorbed on a silver substrate, such as the electrode 41 illustrated in FIG. 1. Such a tetrasulfonated phthalocyanine (TSPc) molecule is represented at 60 in FIG. 6. The molecule 60 is composed of four pyrrole rings 61 and four benzene rings 62 which form greater inner and outer rings. The inner ring may contain two protons which form a metal-free phthalocyanine ($H_2$-Pc) or may have four coordinated central metal ions which creates a variety of metal-phthalocyanines (M-Pc). Such metal ions are represented by the letter "M" in FIG. 6. Such phthalocyanines are available commercially from a number of chemical companies, examples being Kodak Corporation, Rochester, N.Y., Fisher Scientific, Allied Corporation, etc.

Phthalocyanine molecule, are insoluble in aqueous media unless polar groups are added to the molecule. The molecule 60 is tetrasulfonated, as can be seen by the four $SO_3$ polar groups illustrated in the FIG. 7. Sulfonation appears to have a minimal affect on the overall molecular characteristics. Sulfonation and solubility in aqueous media is advantageous to enable dissolving of the molecules in a user friendly medium (e.g., a medium that des not require special conditions such as fume covers or hoods, clean rooms, etc., and are not toxic), such as an aqueous medium and the use thereof in the adsorption process with respect to the electrode, preferably silver, or other substrate. If organic solvent or other solvent is used, then the molecules should be soluble in that solvent for the same reason.

It is noted here that a porphyrine molecule appears somewhat similar to the phthaiocyanine molecule 60 of FIG. 6; the difference is that porphyrine would not have the four benzene rings 62 and bridging nitrogen atoms are replaced by carbon atoms.

EXAMPLE 1

A macrocyclic material, specifically a tetrasulfonated phlthalocyanine, was adsorbed on a silver electrode 41 (FIG. 1). Such molecules 40 were so adsorbed to form a monolayer film on the electrode. The silver electrode 41 was placed in a chemically clean aqueous bathting medium 65 (FIG. 8) of a pH 1 and 0.05 molar of sulfuric acid and $10^{-5}$ molar of macrocyclic (phthalocyanine) material and was subjected to annodization potential of 500 mv. versus a saturated calomel reference electrode 66 for 30 to 60 seconds, a potentiostat type device 67 was used to provide the electrical input for annodization in the usual potentiostat type of technique. This procedure was used to activate the silver and create surface energy states at the interface and to form an adsorbed monolayer of macrocyclic molecules. The application of such potential to the silver is called activation of the silver.

EXAMPLE 2

Example 2 is the same as Example 1 except that the annodization potential was −1.5 volts and the annodization time during which such potential was applied was 1 minute. The results are substantially the same as in Example 1.

EXAMPLE 3

A silver electrode 41 was placed in a chemically clean aqueous bathing medium of 0.05 molar $H_2SO_4$. The electrode 41 was subjected to, e.g., 500 mv. versus the saturated calomel reference electrode for the times, as above described in Example 1 using the apparatus of FIG. 8; this activates the silver electrode. Then the silver electrode was removed from the bathing medium and was dipped into a solution of $10^{-5}$ molar tetrasulfonated phthalocyanine (TSPc) in water; thereafter the electrode was removed and the excess aqueous solution was allowed to evaporate to form a monolayer of adsorbed TSPc on the activated electrode.

EXAMPLE 4

Example 4 is the same as Example 3 except that the annodization potential to activate the silver electrode was −1.5 volts and the annodization time during which such potential was applied was 1 minute. The results are substantially the same as in Example 3.

In Examples 1–4 the molar concentration of subject molecules according to the invention, e.g. phthalocyanines, was selected to achieve adsorption of a monolayer film on the substrate. However, a greater molar concentration, say of $10^{-3}$ may be used if it were desired to adsorb a multilayer film. Moreover, other adsorption techniques may be used including, for example, vacuum deposition, vacuum film growth, epitaxial growth and sputtering. Moreover, adsorption of other subject molecules can be the same as in Examples 1–4 or other examples herein, but it may be necessary to adjust the molar concentrations of the subject molecules in order to accommodate the molecular size to achieve the desired monolayer or multilayer film.

The electro-optical system I was used to examine the adsorbed $H_2$-$TSP_c$ on the silver electrode. The electrode interface with adsorbed $H_2$-$TSP_c$ was illuminated with an argon ion laser line operating at 514.5 nm with output power of about 50 mW. The incident angle was 78.degree. relative to the surface normal. Scattered light was observed at 90.degree. relative to the incident light. The scattered light was analyzed by a Raman spectrophotometer 10 including, e.g. a double monochromator (Spex 1400). A photomultiplier, e.g. ITT FW130, and photon counting equipment were used as the detectors 13, 14. In FIG. 1 the monochromator is shown as grating 11 and screen 12 to illustrate spatial resolution of the light scattered by the molecules 40; however, the preferred Spex 1400 monochromator actually employs a scanning grating/fixed slit system, as is well known.

During such examination the electric potential applied to the molecules 40 was varied by the electrical supply 4. Such supply, for example, included a battery 4a or other voltage supply of D.C. potential and a variable resistor, potentiometer, rheostat 4b. Lead 70 connected one side of the battery to the silver electrode 41. An electrically conductive electrode 71 was connected via a lead 72 to the wiper arm of the variable resistor 4b to bring the potential of the electrolyte 43 to that of the wiper arm. Therefore, the electric potential across the molecules 40 was a function of the adjustment of the variable resistor 4b and the voltage level of the battery 4a.

The laser excited interface of silver and TSPc and electrolyte emitted scattered light in the form of surface enhanced Raman scattering. The activated silver electrode functioned as an amplifier with a typical gain factor of about $10^6$. The spectral components and intensity were a function of the intensity and frequency components of the input illumination and the electric potential across the molecules. The reason for high enhancement of the Raman signal appears to be assigned to new surface energy states, which create conditions for inverse population. The surface enhanced Raman scattering spectra which were obtained from the adsorbed TSPc in this example reliably reveals with reproducibility molecular vibrational properties of the macrocyclic species (TSPc in this case) in their solutions or solid phases, or adsorbed states. Reliable reproduction of molecular vibrational properties also was obtained in other examples by surface enhanced Raman scattering spectra for other adsorbed macrocyclic species.

In analyzing the scattered radiation 21 by the analyzer 10, one or more Raman spectrum lines will occur in response to certain changes of state of an electron within the molecule. Such state change of an electron may distort one of the bonds in the molecule, such as a carbon-carbon bond, a carbon-nitrogen bond, etc. Such state change and/or distortion will change the vibrational characteristics of that bond to cause a particular frequency or spatial distribution of frequencies of the scattered radiation 21.

The surface enhanced Raman scattering spectra obtained from the adsorbed TSPc on the silver electrode of the switch 3 shown in FIG. 1 are illustrated in FIG. 9 for four different electric potentials applied across the molecules 40. The intensities of the Raman lines show an appreciable change when the electrode potential is altered in discrete steps. The spectra in FIG. 9 were recorded with a relatively high resolution of the monochromator by using a 2.5 $cm^{-1}$ band pass. The spectra shown in FIG. 9 were obtained with a non-resonant laser excitation, although additional gain can be achieved by using resonant excitation, i.e. the laser being at a frequency equal to the resonant frequency of the molecule. For TSPc the resonant frequency is about 630 nm, 660 nm, or 340 nm. The peaks identified at 1341 $cm^{-1}$ in the graphs originates from a C—N bond in a pyrole ring, and this represents a spectral component due to the vibration of that specific bond in the molecule. Similarly, the 1521 $cm^{-1}$ peaks represent a spectral component due to vibration in a carbon-carbon bond also in the pyrole ring. The source of the 1620 $cm^{-1}$ spectral component is not known. The four spectra illustrated in FIG. 9 are measured, respectively, with −0.4 volt, −0.2 volt, 0 volt, and 0.2 volt electric potential across the molecules 40 (FIG. 1). The data illustrated in FIG. 9 represent intensity of light at respective frequencies. The intensity scale is in counts of photons per second by the optical detectors 13, 14, and the order of magnitude of the scale is $3 \times 10^4$ counts per second. The frequencies are from about 200 $cm^{-1}$ to about 1700 $cm^{-1}$.

The speed of switching, i.e. the time to respond to a particular input or change in a particular input, of the device 2 illustrated in FIG. 1 can be predicted or determined by inspection of the graph of FIG. 9 and relying on the Heisenberg uncertainty principle. For example, the rise time or fall time of the peak 75 for the carbon-carbon bond in a phthalocyanine molecule at a spectrum line 1521 in the overall Raman spectrum 76 taken at 0.2 volt electric potential applied to the phthalocyanine molecule can be resolved in a time domain. Such resolution indicates a response time on the order of $10^{-13}$ second. The response time was measured by measuring the half width at half height of the particular Raman band. Looking at FIG. 9 that width is measured in inverse centimeters. Such value in inverse centimeters, say 53 $cm^{-1}$, can be converted to frequency domain by multiplication by a factor $30(pi) \times 10^9$ $Hz/cm^{-1}$. The inverse of that result yields time; thus 53 $cm^{-1}$ can be converted to represent $1.98 \times 10^{-13}$ second. Similarly, response times can be obtained for other peaks in the other Raman bands.

From FIG. 9 it will be seen that the response of the phthalocyanine molecule or layer thereof at a given incident light frequency of input illumination and a constant pH will be a function of the electric potential applied across the molecule or layer thereof.

Each of the molecules 40 on use and analysis will yield 20 to 30 peaks in its particular Raman spectrum, such as one of the graphs of FIG. 9 having three of the peaks indicated at 1341, 1521 and 1620 $cm^{-1}$. Each of those peaks may be considered and used as a respective output of the molecule; therefore, each molecule is capable of multiple outputs. Furthermore, each of those multiple outputs usually is of different magnitude relative to the others; hence, such characteristic introduces in the invention a component of multilevel operation.

The speed of such switching or change in an output characteristic of a given macrocyclic molecule or layer thereof in response to a given input or change in input is exceedingly fast, e.g. on the order of $10^{-13}$ second. This fast response time can be used in a variety of ways. One example is to speed the response of information read-out by existing detector apparatus, such as a Raman spectrophotometer. Another example is to link optically and/or electrically two or more devices 2 in accordance with the invention, whereby the output from one directly or indirectly provides an input to the other. In the latter case logic gates and systems having extremely fast operation can be created.

In FIG. 10a is illustrated a graph 90 of the intensity of light re-emitted or scattered by iron-phthalocyanine molecules at the 1346 $cm^{-1}$ frequency, such intensity being graphed with respect to electric potential applied across the molecules or layer 40 (FIG. 1) thereof. As the voltage is increased from about −0.4 volt to about plus 0.2 volt the curve line 91 represents the functional interrelationship between scattered light intensity with respect to applied electric potential. A maximum 92 is reached during the course of that function and variation of potential. When the potential is reduced the graph line 93 is followed, and a peak 94 is achieved. The peak 94 exceeds the magnitude of the peak 92, as can be seen relative to the count per second on the intensity scale. Thus, graph 90 exhibits bistable hysteresis. The graph or curve of FIG. 10a was made using a relatively low resolution or wide band pass of 20 $cm^{-1}$ in the monochromator of the analyzer 10 to accommodate frequency shifts that occur with changes of input potential.

The bistable hysteresis characteristics of the graph or curve 90 can be exploited to provide, for example, a logic function. For example, a measurement of a peak at 92 may be used to represent a digital logic 0 level, whereas a peak 94 may be used to represent a digital logic 1 level. Therefore, the transition of the electric potential from the maximum negative or some point negative before the peak 92 is reached to a more positive level beyond where the maximum 92 is reached can be relied on to identify a logic 0 level; specifically, a signal transition in the input potential from −0.4 volt to +0.2 volt will result in the peak 92 being reached and, thus, the signal transition from negative to positive effectively represents a logic 0. In like manner the positive to negative transition resulting in production of the peak 94 can be used to identify a logic 1 signal. Shown in FIG. 1 is decoding circuitry 100 that may be used to detect such logic signal transitions. Such decoding circuitry 100 may include a pair of level detectors 101, 102, which respectively produce logic 1 output signals when a respective maximum or peak 92, 94 is reached during a particular signal transition. If both of the peaks are produced, then an AND gate 103 will produce a signal at output terminal 104 representing such occurrence, and thus, the excursion from the positive to the negative electric potential. On the other hand, if only the exclusive OR gate 105 produces a signal at its output 106, the same will indicate that only one of such peaks has occurred, i.e. the lower peak 92, and this will indicate and excursion of the electric potential in a positive direction.

Also shown in FIG. 1 is a voltage control 110. The voltage control 110 may be mechanically or electrically connected to the electrical supply 4 in order to adjust the electric potential applied to the molecules 42 in the molecular electro-optical switch 3 (or any of the other molecular electro-optical devices 2 used in accordance with the present invention). Such voltage control 110 may be an amplifier circuit, an electromechanical device that controls the variable resistor 4b, a solid state circuit, a computer type circuit, etc. One purpose of the voltage control 110 is to achieve a desired electric potential applied to the molecules 40; another purpose may be to limit potential; and so on.

Turning to FIG. 10b, the portion 93 of the graph 90 between the peak 94 and the minimum, which occurs at +0.2 volt, is represented at 93'. By using the voltage control 110 (FIG. 1) to limit the electric potential applied to the molecules 40 to that potential shown between about −0.2 volt and +0.2 volt, the bistable hysteresis function of the graph 90 can effectively be eliminated. Moreover, if the voltage control 110 further were operative to limit the electric potential applied to the molecules 40 to that between voltages $V_1$ and $V_2$ shown in FIG. 10b, a near linear relation between electric potential and intensity of light emitted by the molecules 40 at the 1346 Raman spectrum line can be achieved, as is represented at the 30 curved portion 93" in FIG. 10b.

Referring now to FIG. 10c there is shown a cyclic voltammogram corresponding to the adsorbed iron-phthalocyanine on a silver electrode in aqueous solution of 0.05 molar $H_2SO_4$ and illustrates the relationship between voltage and current for this particular adsorbed molecule. In addition, humps or peaks in the cyclic voltammogram indicate oxidation and reduction states of the adsorbed molecules. Cyclic voltammetry can be used to help explain electro-chemical states of the adsorbed molecules and interrelate optical changes of the Raman scattered light to the electro-chemical state of the adsorbed molecules.

Figure 11C:
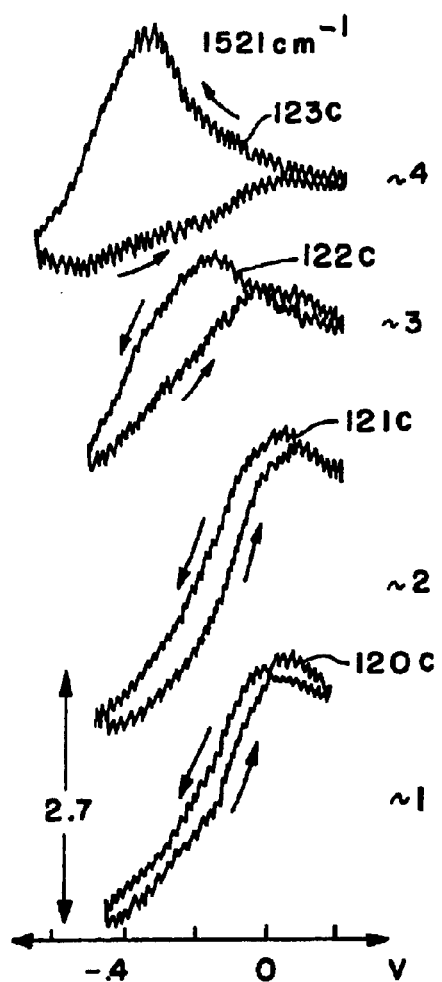

FIGS. 11a, 11b and 11c show graphs or curves of the relationship of intensity of light emitted at certain Raman spectrum lines as a function of the electric potential across the molecules, particularly the phthalocyanine molecules 42 of FIG. 1, at different respective pH levels of the electrolyte 43. For example, in FIGS. 11a and 11b the five pairs of graphs 120a–124a and 120b–124b respectively show the functional relationship of intensity versus electric potential applied to the layer of molecules 42 (FIG. 1) for light emitted at the 1620 $cm^{-1}$ Raman spectrum line and 1341 $cm^{-1}$ Raman spectrum line for different respective pH of the electrolyte 43. Such pH levels, respectively, are represented by the illustrated digits 1, 2, 3, 4, and 7 adjacent the respective curves. The intensities illustrated in FIGS. 11a and 11b are relative intensities and are not intended to represent absolute intensities. However, for frame of reference, the distance indicated 4.8 in FIG. 11a represents a scale of $4.8 \times 10^4$ counts per second, and the distance 2.1 in FIG. 11b represents a scale of $2.1 \times 10^4$ counts per second, as measured by the above mentioned photo detector equipment.

In FIG. 11c are four respective graphs 120c–123c similar to those described above but measured with a monochromater setting 1521 $cm^{-1}$ in the system FIG. 1 at the four different indicated pH concentration levels 1, 2, 3, and 4 shown in FIG. 11c.

Figure 11D:
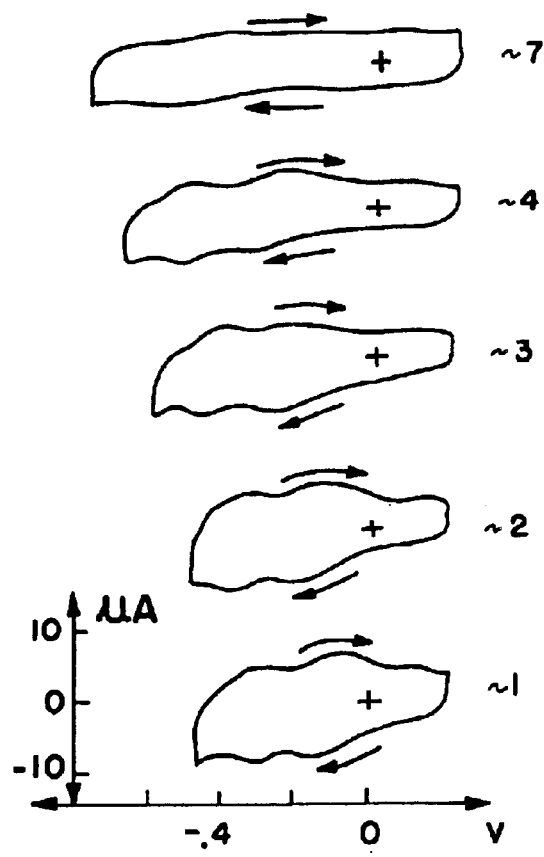
FIG. 11*d* is an illustration of respective cyclic voltammograms corresponding to such pH levels.

In FIG. 11d are illustrated 5 respective cyclic voltammograms for the respective pH concentrations 1, 2, 3, 4, and 7 corresponding, for example, to the graphs illustrated in FIGS. 11a, 11b and 11c.

From the graphs illustrated in FIGS. 11a–11d, it will be seen that pH concentration of the electrolyte 43 may have a significant affect on the functional relationship between intensity of emitted light of the molecules 40 and the electric potential applied to the molecules. A more linear relationship appears to occur at the lower pH levels. Various portions of the curves or functional interrelationships of intensity and electric potential can be used to achieve certain desired outputs with respect to linearization or measurements over particular ranges, etc. Likewise, parameters can be selected to accomplish the above-mentioned decoding of electric potential change direction and maxima to optimize desired optical/electric outputs for particular uses and equipment.

EXAMPLES 5A AND 5B

Examples 5A and 5B are the same as Examples 1 and 2 except that porphyrine is substituted for the phthalocyanine. The results of operation are substantially the same as those described above.

EXAMPLES 6A AND 6B

Examples 6A and 6B are the same as Examples 1 and 2 except that chlorophyl is substituted for the phthalocyanine. The results of operation are substantially the same as those described above.

EXAMPLES 7A AND 7B

Examples 7A and 7B are the same as Examples 1 and 2 except that heme is substituted for the phthalocyanine. The results of operation are substantially the same as those described above.

EXAMPLES 8A AND 8B

Examples 8A and 8B are the same as Examples 1 and 2 except that cytochrome was substituted for the phthalocyanine. The results of operation are substantially the same as those described above.

In Examples 5–8 changes in the molar concentration of the molecules in the solvent or bathing solution may have to be made to obtain the desired monolayer or multilayer film. Also, in all the above examples, although the solvent may be water for water soluble molecules, or may be any ion conducting medium, the solvent used in the annodizing bath or dipping bath may be another, such as an organic solvent, in which the molecules will dissolve.

In each of the examples described above the substrate 41 is a silver electrode, which exhibits enhancement of the Raman scattered light due to the activation of the silver electrode in the electrolyte described above. However, other substrates or electrodes may be used. The inventor believes that such activation of silver electrodes is due to the formation of energy states which support a mechanism of inverse population. Such activation of the substrate or electrode 41 appears to enhance significantly the output of the molecular electro-optical device 2, particularly the switch 3.

In the preferred embodiment and best mode of the present invention a semi-conductor material is substituted for the electrolyte bath 43 of the switch 3 shown in FIG. 2. The molecules of the type described above, accordingly, are used in a semi-conductor type device that does not require an electrolytic bath. For such semi-conductor devices the molecules preferably are of a type that have or are capable of having doped semi-conductor characteristics, and examples of such semi-conductor type devices are the transistors 30, 31, 32, or 33 illustrated in FIGS. 2–5, respectively. The invention also may be employed in semi-conductor devices other than transistors.

Referring to the transistor 30 (FIG. 2) as exemplary, the molecules 40 are adsorbed onto the substrate 50 or are otherwise deposited thereon to form the n-p junction 34. A further p-n junction 35 is formed by applying another layer 51 of semi-conductor material over the molecules 40. The layer 51 preferably is rather thin so that it is optically transmissive to the incident light 20, allowing the same to impinge on the molecules 40, and to the light scattered or emitted by the molecules 40, which is represented at 21. In the preferred embodiment and best mode of the invention, the molecules 40 are macrocyclic which naturally have p type doped semi-conductor characteristics. Accordingly, the semi-conductor layers 50, 51 preferably are n type doped semi-conductor material. The preferred macrocyclic molecules and the preferred semi-conductor type materials for the layers 50, 51 are listed above. Other materials also may be used as long as they have similar characteristics of operating in the manner of a semiconductor or doped semi-conductor material. The semi-conductor devices also may be other than transistor devices, for example diodes. Instead of the npn device illustrated, the device may be a field effect transistor (FET).

Operation of the molecular electro-optical transistor 30 is similar to operation of the molecular electro-optical switch 3 described above with reference to FIG. 1, and as was mentioned above the transistor 30 may be substituted for the switch 3 in the system 1. More particularly, electric potential or other electric input can be applied to the molecules 40 via the leads 52a, 52b, 52c and the semiconductor layers 50, 51. The electric supplies 36, 37, which preferably are DC voltage sources, provide the needed power. Incident light 20 is directed through the layer 51 onto the molecules 40. In response to that incident light and the electric potential, the molecules will scatter or re-emit light 21 in the same way that the molecules 40 respond, as is described above with reference to FIG. 1. A unique advantage of the molecular electro-optical transistor 30 is that such device operates not only as a device capable of providing an optical output, but also such device functions in the same way as a conventional transistor device. Thus, for example, the transistor 30 may be used in an emitter follower configuration, as an amplifier for electrical signals, etc. Therefore, the transistor 30 has a plurality of capabilities both in the electronic usage thereof, in the optic usage thereof, and in the combined electro-optical usage thereof. Also, electrical read-out of optical signals can be achieved because the electrical characteristics of the device 30 will vary as a function of incident light 20. A particular advantage of the transistor 30 over the switch 3 is the portability of the transistor. Specifically, a relatively non-portable electrolyte is not required for the transistor 30; rather, the electrical input required for operation to affect the optical output in the transistor 30 is achieved by the material forming the semi-conductor layers 50, 51.

FIGS. 2, 3, 4 and 5 can be distinguished, as follows. In FIG. 2 the molecules 40 in accordance with the invention make up a monolayer, i.e. about one molecule thick, between the semi-conductor layers 50, 51. In FIG. 3, the molecules 40 form a multi-layer 140 thereof between the semi-conductor layers 50, 5 1. In FIG. 4 the molecules 40 form a monolayer and are actually adsorbed onto an electrically conductive substrate 141, such as silver or silver oxide which is located between the semi-conductor layer 50 and the molecules. Such conductor 141 may be employed to achieve the desired electric potential application to molecules 40 but could be eliminated, as in the transistor 30, if adequate electric potential can be applied to the molecules 40 in the monolayer using only the semi-conductor materials 50, 51. Another advantage to using the layer 141, especially if it is silver, is the possibility of activating the same to achieve gain effect mentioned above. In FIG. 5 the transistor 33 has a multi-layer 142 of molecules 40, and those molecules are adsorbed onto the metal conductor substrate 143 as in the case of the conductor 141 described with reference to the transistor 32 in FIG. 4. Operation of the several transistors 31, 32, and 33 would be the same as operation described above for the transistor 30.

EXAMPLE 9

Processes similar to those described above may be used to deposit/adsorb subject molecules onto semi-conductor material, especially using dipping, sputtering, vacuum deposition and epitaxial growth. The bathing medium may have to be altered to avoid corrosivity with respect to the semi-conductor substrate material. Formation of macrocyclic films on semiconductor substrates can be achieved by conventional techniques, and the same is true with respect to formation of semi-conductor film in the macrocyclic material. Thus, for example, using available semi-conductor techniques and the preferred macrocyclic molecules a device can be made having the macrocyclic molecules sandwiched between the to semi-conductor layers.

Both the switch 2 and transistors 30–33 may be used in accordance with the invention to provide a switching function. Specifically, in response to the input light and a particular electric potential, the output light or a particular spectral component thereof may be switched on or off. The speed of response of such switch is on the order of $10^{-13}$ second and may be as fast as the order of $10^{-15}$ second, especially if the molecule exhibits tunneling. The invention also may be used to modulate the intensity of an output signal as a function of incident illumination on the molecules 40 and/or electric potential applied thereto. Response to such modulation likewise is extremely fast. Such switching and modulating operations can be employed in a way that a single input, either optical or electrical, can affect multiple outputs, e.g. in the form of the individual spectrum components of the scattered or re-emitted light from the molecules.

Figure 12:
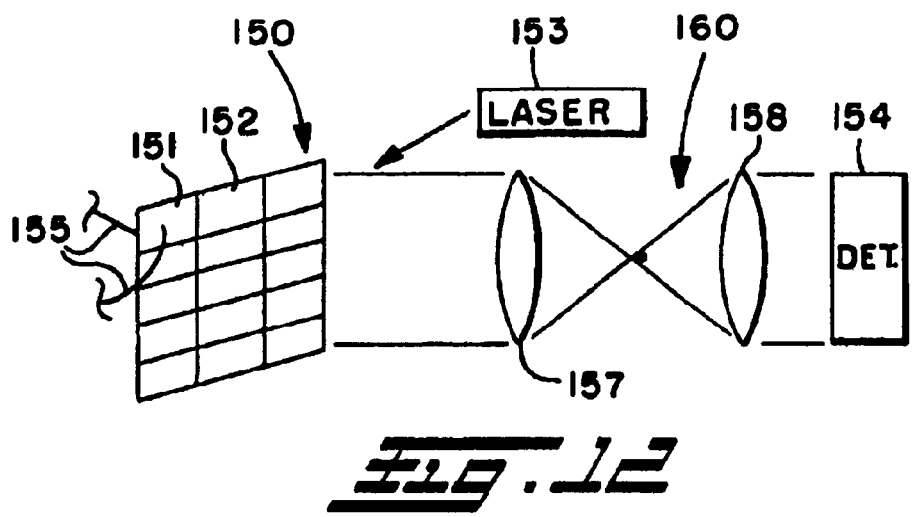
FIG. 12 is a schematic illustration of an electro-optical memory and read-out system in accordance with the invention.

In FIG. 12 is illustrated an embodiment of the invention used as an electro-optical memory or read-out type of device. Such memory is depicted at 150, and it includes an array of a plurality of cells, such as those identified 151, 152. Each cell may be in the form of a molecular electro-optical transistor 30 including discrete doped semi-conductor layers 50, 51, etc. with a monolayer or multiple layers of molecules 40 therebetween. Thus, it will be appreciated that the solid state or semi-conductor embodiments of the invention have an important advantage of conveniently lending to inclusion in a relatively large scale (in terms of actual cells) but small size memory or read-out type device. As an example, using presently available technology each cell can be on the order of 2 microns by 2 microns; therefore, a density of $0.25 \times 10^8$ of unit cells or elements per square centimeter can be achieved. Upon application of appropriate electric potential to the molecules in a given cell such as cell 151, the same operates substantially identically to molecular electro-optical transistor 30 of FIG. 2. Such cell may be optically scanned by a conventional laser scanner 153, and in response to such scanning and the potential across the molecules 40 of the individual cell, such cell will emit light 21 which can be detected and analyzed by the optical detector/analyzer 154, which may be analogous to the Raman spectrophotometer 10 described above in detail with reference to FIG. 1.

The laser 153 may illuminate the entire array of cells. Leads schematically shown at 155 may be used to alter the potential of respective cells. The detector/analyzer 154 may include a focusing lens 157 and a focal plane lens 158 which cooperate to collect light scattered by respective cells producing beyond the lens 158 an image that can be analyzed by the Raman spectrophotometer 10 or by other optical detector means. In the case that laser simultaneously illuminates all or, in any event, more than one cell in the device 150, the detector 10 will have to scan the cells. Alternatively, as was mentioned above, respective cells may be coupled directly to other cells in another device 150 which responds to the outputs and/or excitation of the former. As a further alternative, a non-scanning detector 10 may be used if the laser 153 scans discrete cells of the array device 150.

The memory/read-out device 150, scanner 153 and detector/analyzer 154 form an electro-optical read-out system 160. The system 160 can be used to detect electric potential of a given cell and to convert that information to optical information for subsequent detection in the detector/analyzer 154. Minimum current flow and, therefore, minimum power is required by the memory device 150 to maintain the electric potential across the respective molecules 40 in the individual cells. Such electric potential can be discretely controlled for individual cells by computer or other means connected by the illustrated leads to the respective semi-conductor layers. Since there is minimum electric power required for the device 150, the amount of heat emitted thereby will be minimized. Since the operation of the molecules 40 is extremely fast, scanning in the system 160 also can be extremely fast, thus potentially increasing the speed of operation capability of the computer or other apparatus in which the system 160 is included. Another important advantage of the system 160 is the ability to rely on multiple outputs from each cell so that each cell has the capability of actually storing multiple information, given electric potential condition thereof, for example.

Thus, it will be appreciated that the invention may be used to effect prompt conversion of electrical signals and/or information to optical signals and/or information. Moreover, the invention may be used to facilitate fast optical read-out of an electrical memory device.

The optical amplifier illustrated in FIG. 7 may be substituted in the switch 2 or one of the molecular electro-optical transistors 30–33 for the layer or layers of molecules 40 therein. In the light amplifier molecular structure 38 there are a plurality of molecules 40 in accordance with the present invention, preferably macrocyclics, and most preferably phthalocyanine, which are placed in close proximity to each other and may be chemically bonded to each other. Preferably such molecules 40 are such that they are stacked or otherwise relatively adjacent to each other generally in the manner illustrated in FIG. 7. The amplifier 38 also includes a light sensitive input molecule 200, in the preferred embodiment and best mode of the invention rhodopsin, chemically bonded to the molecules 40 in the outer layer. The light sensitive input molecule 200 responds to light input generally or to a particular frequency/wavelength characteristic by going into an excited state. In such excited state, an electron is freed or becomes more excited than in its unperturbed state. Such excitation is readily transferred directly to a molecule 40 to which the light input molecule 200 is chemically bonded. Such bonding may occur in a way similar to the way in which one of the $SO_3$ polar groups is attached to the phthalocyanine molecule in FIG. 6. Thus, as is illustrated in FIG. 7 there are 3 phthalocyanine molecules 201, 202, 203, and the light sensitive input molecule 200 is chemically bonded to the first phthalocyanine molecule 201 using available organic synthesis techniques. The excitation of the light sensitive input molecule 200 is transferred to the electro-optical molecule 201 causing the latter to become excited and to emit light of a particular spectral characteristic. That light and such excitation are transferred to the next adjacent electro-optical molecule 202, e.g. another phthalocyanine, further exciting the same and causing the same to emit light of the same spectral components; but in this case the preferred spectral components will be of greater intensity than those of the light emitted by the molecule 201 because of the dual excitation of the molecule 202, both in terms of the transferred electrical excitation and the optical input thereto. The same type of amplification occurs with respect to the molecule 203 in response to inputs from molecules 202. A light output 21, then, is produced at the last molecule 203 in response to the light input 20 to the input molecule 200. The light input 20 may have a spectral component identical to one of the amplified spectral components included in the light output 21. However, due to the above described amplification effect, the intensity of the noted spectral component in the light output 21 may exceed the intensity of the same spectral component included in the light input 20.

Accordingly, the light sensitive input molecules 200 may be used to couple light inputs to respective molecules 40 in accordance with the present invention to enhance the intensity of preferred spectral components in the light output produced thereby. The invention has application in optical communication transmission devices, e.g. by selectively amplifying light of a particular frequency, such as that to which the input molecule is especially sensitive.

Another technique for enhancing or increasing the intensity of the light output, and particularly the intensity of a specific spectral component from the molecules 40 is to provide thereto optical input at a frequency that is substantially identical to the frequency of the natural vibration of the molecular bond thereof. For example, the Raman spectrum line at 1341 $cm^{-1}$ shown in FIG. 9 is due to the natural vibrational frequency of a carbon-nitrogen bond. The desired frequency of the incident light to the molecules 40 at the frequency which corresponds to such 1341 $cm^{-1}$ spectral line can be achieved by using two coherent monochromatic light sources, such as lasers 6, 7 which interfere with each other so as to produce incident illumination that is at a frequency corresponding to such 1341 $cm^{-1}$ Raman spectrum line. Such illumination is in accordance with the coherent anti-Raman Stokes principle. Operation using such principle results in a much higher intensity output from the molecules 40. However, such operation according to such principle will result in only a single output being produced by the molecules 40 rather than the multiple outputs described above. By scanning one of the laser frequencies an enhancement of the Raman signal at other frequencies can be achieved.

Figure 13:
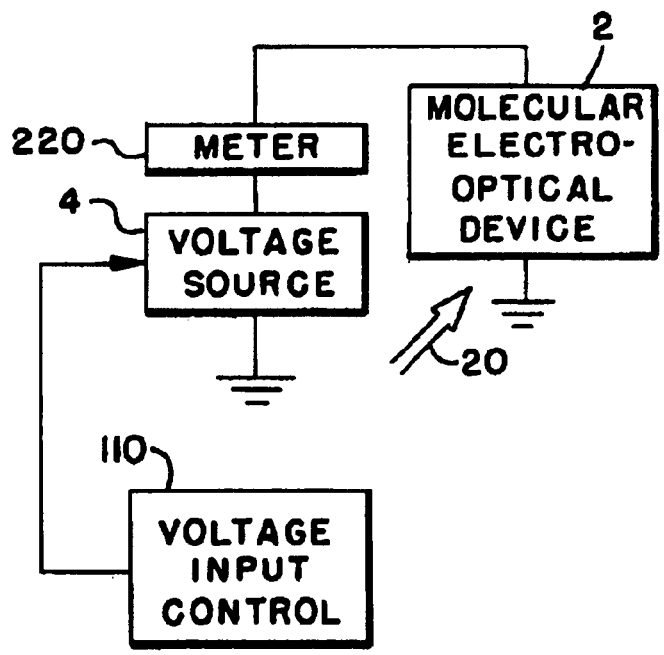
FIG. 13 is a schematic illustration of an electrical read-out arrangement for a molecular electro-optical device in accordance with the invention.

Briefly referring to FIG. 13, there is shown schematically a circuit for reading electrically the response of a device 2 according to the invention to an optical input and a particular potential input. A voltage input control 110 controls the magnitude of electric potential applied by the source 4 to the device 2. A meter 220 reads current, for example, to detect the response of the device 2 to the input potential and input light. This exemplary read-out or other ones may be used with the several embodiments of the invention described herein to obtain an electrical read-out of optical or even of electrical input to the device 2.

In view of the foregoing, it will be appreciated that the invention may be used as an electro-optical switch or as an electro-optical semiconductor device. In the latter case, the semi-conductor device most preferably is an electro-optical transistor. However, the invention may be employed with other types of semi-conductor systems, such as four or more semi-conductor layer systems, etc. Inputs may be provided by conventional lasers, semi-conductor laser devices, and other sources of optical illumination, preferably of the monochromatic type and most preferably of the coherent type. The materials of which the invention may be employed are described above. Other materials that would function equivalently also may be employed. The invention also embodies methods of switching, modulating and amplifying consistent with the above description.

Molecular Structure Alters Device's Functionality

The following discussion concerns how molecular structural design alters functional behavior of the molecular/quantum devices of the invention, e.g., the various macrocyclic molecules, etc., as are disclosed. In an example, monomeric metallized phthalocyanine behaves as a fast ($<10^{-12}$ second), energy efficient (3OkT/bit of information, where "k" is the Boltzmann constant and "T" is absolute temperature), fully reversible quantum switch with multiple outputs. However, if monomeric phthalocyanines are organized in structural combinations such as one dimensional wire-like ring-stacked (e.g., see FIG. 14b), or two dimensional sheet-like ring-fused phthalocyanines (e.g., see FIG. 14c), their electro-optical properties are significantly altered or different from a single monomeric phthalocyanine. As a consequence, their functionality behaves with new remarkable properties that can replace a multiplicity of CMOS and similar classic semiconductor devices.

Methods for making stacked macrocyclic molecules of the type shown in FIG. 14b are known by those having ordinary skill in the art, for example, as published in the text by Malcom Kenny. Methods for making two dimensional macrocyclic molecule structures as illustrated in FIG. 14c also are known by those having ordinary skill in the art, for example, as published in the text by Coleman et al.

In FIGS. 14a and 14b the macrocyclic molecules are phthalocyanine structures with silicon, e.g., one or more silicon atoms, in the center, as is illustrated. Such molecules sometimes are referred to as silicon phthalocyanine. In FIG. 14c the macrocyclic molecules are phthalocyanine structures with metal, e.g., on or more metal atoms, in the center, and these may be referred to as metallo-phthalocyanines. Exemplary metals are cobalt, iron, copper, nickel, silver, gold, palladium, platinum, aluminum, etc. Hydogen may be considered or behave a metal in such phthalocyanine structures, and, therefore, may be included in such group of metals.

U.S. Pat. No. 4,804,930 describes that phthalocyanine molecules, as molecular monomeric units or in general electrochemically semi-organized forms, that can provide a variety of electro-optical properties. Fast switching effect, multilevel logic, memory states are experimentally documented.

According to the present invention, applicant has discovered that phthalocyanine molecules can form basically three structural forms shown in FIG. 14. In FIG. 14 monomeric molecular units are represented as well as a polymeric combination shown as one dinensional" ring-stacked "wire" like structure and two dimensional ring-fuised "sheet" like structures. FIG. 14 is a schematic representation of different phthalocyanine structures, representing (a) monomer, (b) ring stacked, and (c) polymer sheet. All three basic structures can have various metals (cobalt, iron, copper, nickel, silver, gold, palladium, platinum, aluminum, etc.) in the center of the molecule.

Note that in FIGS. 14a and 14b the phthalocyanines include silicon in the center. In the fused polymer sheet arrangement of FIG. 14c, there is a metal M in the center of each phthalocyanine arrangement. In FIG. 14a several oxygen atoms (O) are illustrated; in FIG. 14c there are double bond nitrogen (N) as shown and there are groups of HOOC and COOH.

In the example of ring-stacked silicon phthalocyanine with a base of 1×1 nm (nanometer) and length which depends on the number of molecules, electrical and optical properties are changed significantly depending on the number of silicon phthalocyanine molecules in the stack, e.g., from one through 4, as are illustrated and described below with respect to FIG. 15. Cyclic voltammograms shown in FIG. 15 indicate substantial alteration in the electrochemical behavior of the phthalocyanine molecules in the respective structures illustrated, respectively, as monomer, dimer, trimer and tetramer. The cyclic voltammograms are fully reversible and represent fully reversible memory states. It is interesting to note that the number of peaks in the cyclic voltammograms increase proportionally with number of stacked rings in the "wire". As a consequence one can "tailor" and achieve as many stable states that are proportional to the number of rings. This kind of electrical behavior with multiple reversible stable states is highly desirable in neural network computers which require multiple energy states expressed in Hopfield -energy curve.

Figure 15:
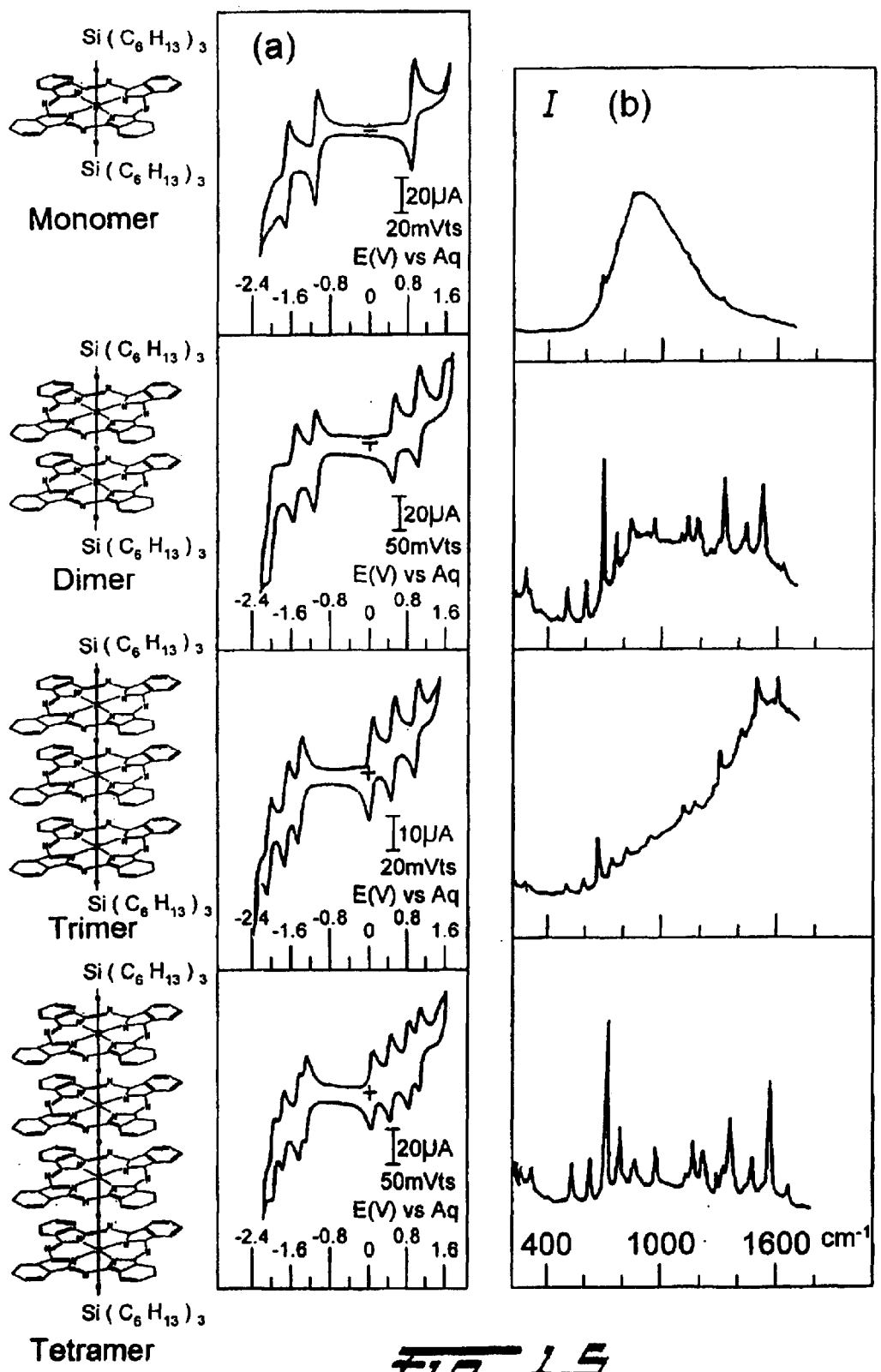
FIG. 15 is a group of illustrations of four different arrangements of macrocyclic molecules, e.g., phthalocyanines (Pc), in the form of oxygen bridged (O—Si—Pc)$_n$ for n=1, 2, 3 and 4; the respective cyclic voltammograms of each of those macrocyclic molecule arrangements obtained from $10^{-3}$M (O—Si—Pc)$_n$ in 0.1M tetra-n-butylammonium perchlorate in $CH_2Cl_2$ adsorbed on a platinum electrode to depict electrical signal characteristics of the macrocyclic molecule arrangements; and the respective depolarized resonant surface-enhanced Raman spectra of the four different arrangements of such macrocyclic molecules obtained from (O—Si—Pc)$_n$ adsorbed on a silver electrode at 0V versus SCE (saturated calumel a electrode), laser excitation at 632.8 nm and 20 mW output power, the electrolyte being 0.05M $Na_2SO_4$ saturated with argon gas.

FIG. 15 is an illustration of electro-optical properties of oxygen bridged $(O-Si-Pc)_n$ for n=1, 2, 3 and 4 respectively illustrated along the left vertical column as monomer, dimer, trimer and tetramer. These are respective "stacks" in a one-dimensional or wire-like form. Thus, the monomer is a single phthalocyanine molecule, which is illustrated with silicon in the center; and the dimer, trimer and tetramer arrangements are respectively stacks of two, three or four phthalocyanine molecules. The middle or center column in FIG. 15 illustrates cyclic voltammograms obtained from $10^{-3}$M $(O-Si-Pc)_n$ ("M" means molar) in 0.1M tetra-n-butylammonium perchlorate in $CH_2Cl_2$ adsorbed on a platinum electrode, the respective phthalocyanine molecules being arranged or organized in the respective monomer, dimer, trimer, tetramer) forms shown immediately to the left of the given voltammogram. In the right column of FIG. 15 depolarized resonant surface-enhanced Raman spectra obtained from $(O-Si-Pc)_n$ adsorbed on a silver electrode at 0V (volts) versus SCE (saturated calumel electrode), laser excitation at 632.8 nm and 20 mW (milliwatts) output power, the electrolyte is 0.05M (molar) $Na_2SO_4$ saturated with argon gas. Thus, the graphs in the center column depict the electrical characteristics of signals obtained in response to respective inputs to the respective macrocyclic molecule arrangement and the curves of the right-hand column represent the optical response.

Furthermore, multivalued redox states in the cyclic voltammograms correspond to one-electron transfer between the rings at the rate of less than a picosecond. As a result of such electronic behavior one can obtain electrical current of the order of $10^{-7}$ A/1 $nm^2$ at room temperature. This current density actually represents more than $10^7$ $A/cm^2$ (square centimeter) and one of the criteria required for superconductivity at room temperature.

On the other hand for the four ring-stacked and higher structures optical properties expressed as surface enhanced Raman spectra, behave in the same way as the spectrum obtained from a monomeric unit. This information indicates that the optical signals can be used in similar ways as discussed in the above patent.

Figure 16:
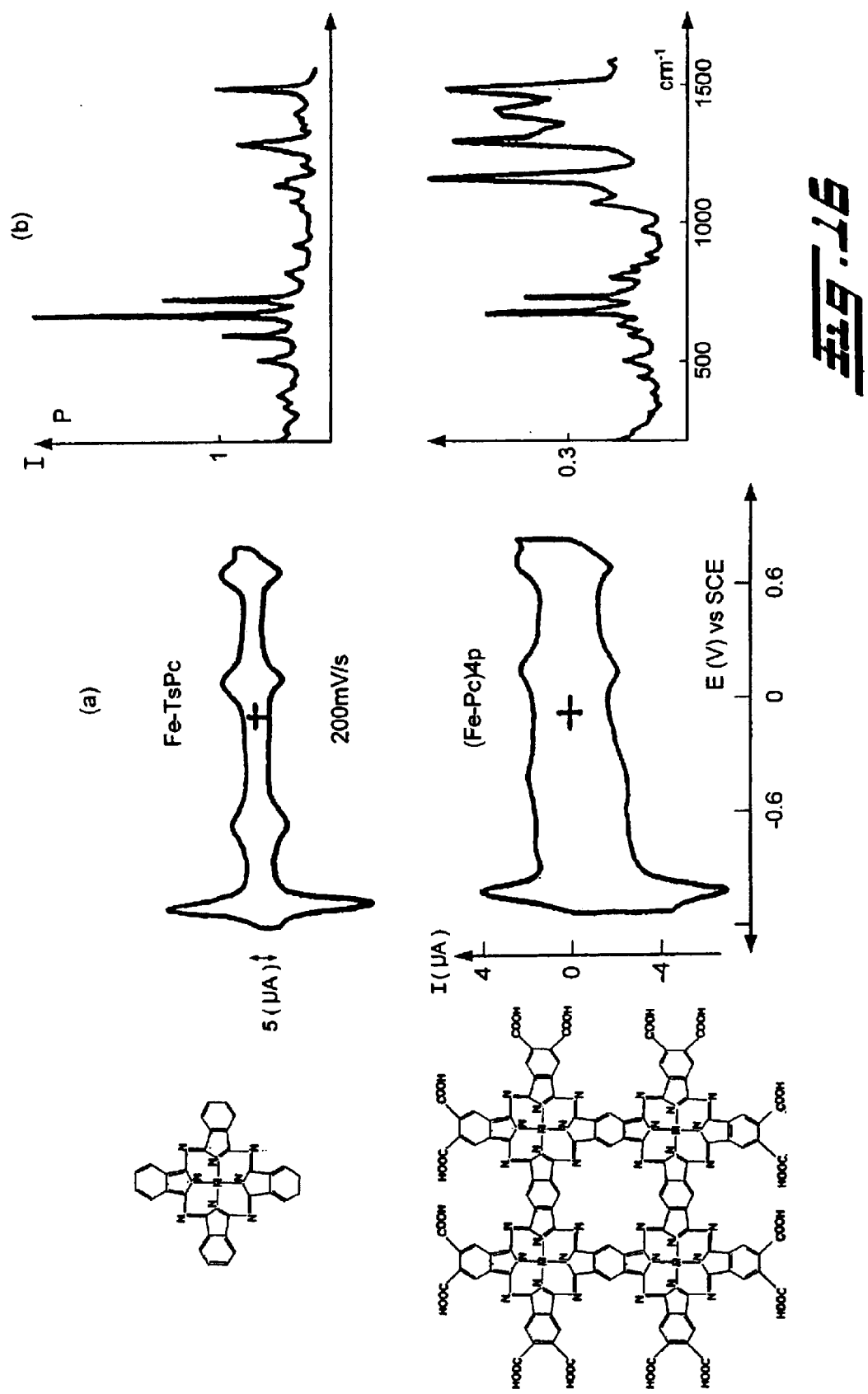
FIG. 16 is a group of illustrations of electro-optical properties of Fe-TsPc (sometimes referred to as a metallo-phthalocyanine) monomer and polymeric sheet (Fe-Pc)4p including (a) cyclic voltammograms to illustrate electrical properties, and (b) surface-enhanced resonant Raman spectra to show optical properties, laser excitation at 632.8 nm with 20 mW output power.

In another example of the two dimensional fused-ring "sheet" polymeric phthalocyanine (see FIG. 16) reversible redox states of the metal ion, for example, iron, at the center of the molecule are unaffected by the process of polymerization. FIG. 16 is an illustration of electro-optical properties of Fe-TsPc monomer and polymeric sheet (Fe-Pc)4p: (a) cyclic voltammograms, (b) surface-enhanced resonant Raman spectra, laser excitation at 632.8 nm with 20 mW output power. The effect of polymerization deforms the organic rings of benzene and pyrrole which affect optical signals in the high-frequency region at about 1300 cm$^{-1}$ (see FIG. 17).

FIG. 17 is a curve representing the pulse code firing rate of a neuron represented as a variation of the intensity of a Raman line obtained from Fe-TsPc adsorbed on a silver electrode. The curve at the top of FIG. 17 represents electro-optical characteristics of the device under test, e.g., a molecule of Fe-TsPc adsorbed on a silver electrode. Variation of one of the optical Raman lines with respect to applied electrical potential on the electrode of the device being used or tested. The lower curve of FIG. 17 represents electrical characteristics of the Fe-TsPc molecule adsorbed on a silver electrode. In this lower curve electrical current vs. electrical potential is illustrated.

Figure 18:
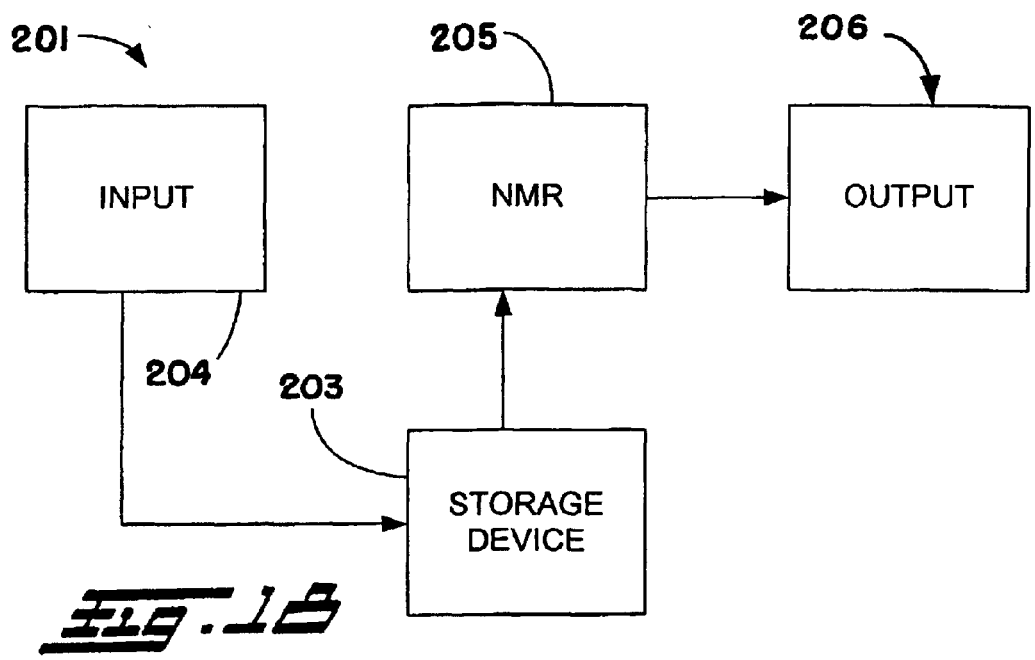
FIG. 18 is a schematic illustration of a memory system using the macrocyclic molecules and arrangements thereof with a nuclear magnetic resonance readout device.
Figure 19:
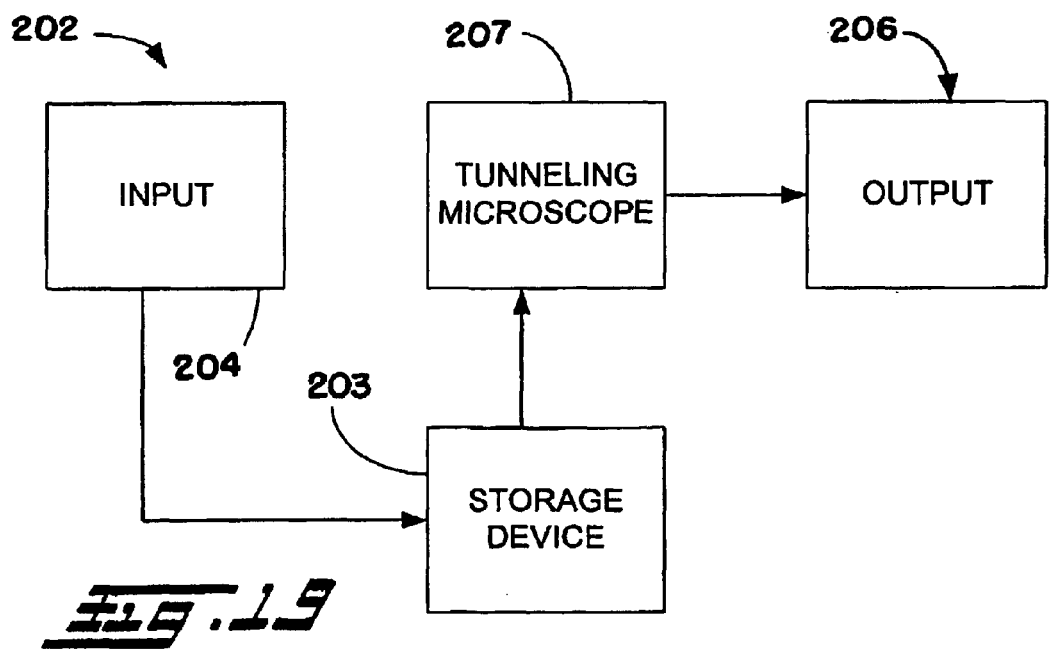
FIG. 19 is a schematic illustration of a memory system using the macrocyclic molecules and arrangements thereof with a tunneling microscope readout device.

Turning briefly to FIGS. 18 and 19, respective information storage and retrieval systems 201, 202 are illustrated. In these embodiments 201, 202, the metal in the macrocyclics, such as phthalocyanines, porphyrines, chiorophyls, hemes, or cytochromes, (metallated macrocyclic) is a magnetic material or magnetically responsive material as the metal or as at least part of the metal component thereof. Exemplary magnetic materials are iron, nickel, etc. Thus, the metal "M" shown in the molecule of FIG. 6, for example, or the metal component of the molecules shown in the monomer of FIG. 14a, ring stacked (primarily one dimensional arrangement) of FIG. 14b, or polymer sheet (primarily two dimensional arrangement) of FIG. 14c may be a magnetic metal. The magnetic properties of these in metallo-phthalocyanine metals may be used to store information at high densities. In an example, such a device may have a potential density on the order of from about $10^{12}$ to about $10^{14}$ sites (or locations for "bit" storage, i.e., storage of a bit of information) per square centimeter.

The magnetic properties of such molecules provides the ability to address and to store information. The orientation of the spin direction of the atoms, e.g., nuclear spin may be representative of information. For example, there may be distinct spin orientations, sometimes referred to as "up" and "down." These may be representative of the magnetic dipole direction and may represent a bit of information. Sometimes such a bit of information is referred to in quantum computer devices or quantum switch devices as Q" bit.

An information storage device of the type described above that includes macrocyclic molecules with magnetic material is illustrated schematically at 203 in FIG. 18 in the information storage and retrieval system 201. The device 203 includes macrocyclic molecules arranged as a monomer (FIG. 14a), ring stack (FIG. 14b), polymer sheet (FIG. 14c), or as a monomer, dimer, trimer or tetramer, as are illustrated schematically in FIG. 15, etc. An input device 204 applies an input to one or more respective molecules. The input may be electrical, optical or magnetic, as has been described above. In response to a given input, the spin orientation associated with a given molecule (or molecules) or with the magnetic material thereof, assumes a given orientation, e.g., switches to a new orientation or maintains the same orientation as it had prior to the application of the input. A readout device 203 reads out the spin orientation of the molecule(s). Reading out can be based on standard magnetic readout devices. An example of such a readout device is a nuclear magnetic resonance type of device 205.

If desired, as is illustrated in the system 202 of FIG. 19, high resolution readout can be obtained using a tunneling microscope principle in which the tip is on the order of atomic size. Such a tunneling microscope device is illustrated at 206 in FIG. 19.

I claim:

1. A switching device comprising a macrocyclic molecule arrangement in at least one of a substantially one dimensional stack arrangement or a two dimensional arrangement, said arrangement being adsorbed on a substrate, wherein macrocyclic molecules in said arrangement are metallated, wherein the metallated macrocyclic molecules include one or more metals selected from the group cobalt, iron, copper, nickel, silver, gold, palladium, platinum, aluminum.

2. An information storage and retrieval apparatus comprising a memory device comprising a macrocyclic molecule arrangement in at least one of a substantially one dimensional stack arrangement or a two dimensional arrangement, said arrangement being adsorbed on a substrate,
an input to apply optical or electrical input, and a detector to detect the output or response from the memory device, said detector comprising a nuclear magnetic resonance device.

3. An information storage and retrieval apparatus comprising a memory device comprising a macrocyclic molecule arrangement in at least one of a substantially one dimensional stack arrangement or a two dimensional arrangement, said arrangement being adsorbed on a substrate,
an input to apply optical or electrical input, and a detector to detect the output or response from the memory device, said detector comprising a tunneling microscope.

4. A reversible quantum switch with multiple outputs, comprising a switching device comprising a macrocyclic molecule arrangement in at least one of a substantially one dimensional stack arrangement or a two dimensional arrangement, said arrangement being adsorbed on a substrate, said metallated macrocyclic molecules comprising metallo-phthalocyanine molecules.

5. A reversible quantum switch with multiple outputs, comprising a switching device comprising a macrocyclic molecule arrangement in at least one of a substantially one dimensional stack arrangement or a two dimensional arrangement, said arrangement being adsorbed on a substrate, said arrangement of macrocyclic molecules comprising silicon phthalocyanine.

6. A method of obtaining multiple outputs from a switching device, comprising applying an input to an arrangement of macrocyclic molecules in at least one of a substantially one dimensional stack-like or ring-like structure or a substantially two dimensional sheet-like structure, and responding to multiple outputs, said responding comprising detecting response using nuclear magnetic resonance.

7. A method of obtaining multiple outputs from a switching device, comprising applying an input to an arrangement of macrocyclic molecules in at least one of a substantially one dimensional stack-like or ring-like structure or a substantially two dimensional sheet-like structure, and responding to multiple outputs, said responding comprising detecting response using a tunneling microscope.

8. A molecular/guantum device, comprising a monomeric metallated phthalocyanine that behaves as a fast ($<10^{-12}$ second), energy efficient (3OkT/bit of information), fully reversible quantum switch with multiple outputs, wherein the monomeric phthalocyanines are organized in structural combinations of at least one of one dimensional wire-like ring-stacked, or two dimensional sheet-like ring-fused phthalocyanines, wherein the functionality of the molecular metallated phthalocyanine behaves with properties that can replace a multiplicity of CMOS and similar classic semiconductor devices.

9. A switching device comprising a macrocyclic molecule arrangement in at least one of a substantially one dimensional stack arrangement or a two dimensional arrangement, said arrangement being adsorbed on a substrate, wherein the phthalocyanine molecules can form basically three structural forms.

10. The device of claim 9, wherein the phthalocyanine molecule forms include monomeric molecular units or a polymeric combination as one dimensional ring-stacked "wire" like structure and two dimensional ring-fused "sheet" structures.

11. The device of claim 10, wherein each of the three basic structures can have various metals (cobalt, iron, copper, nickel, silver, gold, palladium, platinum, aluminum) in the center of the molecule.

12. A switching device comprising a macrocyclic molecule arrangement in at least one of a substantially one dimensional stack arrangement or a two dimensional arrangement, said arrangement being adsorbed on a substrate, comprising ring-stacked silicon phthalocyanine with a base on the order of 1×1 nm and length which depends on the number of molecules.

13. A switching device comprising a macrocyclic molecule arrangement in at least one of a substantially one dimensional stack arrangement or a two dimensional arrangement, said arrangement being adsorbed on a substrate, wherein the two dimensional arrangement of macrocyclic molecules comprises a two dimensional arrangement of fused macrocyclic molecules.

14. A memory device comprising a macrocyclic molecule arrangement in at least one of a substantially one dimensional stack arrangement or a two dimensional arrangement, said arrangement being adsorbed on a substrate, wherein the two dimensional arrangement of macrocyclic molecules comprises a two dimensional arrangement of fused macrocyclic molecules.

15. A method of obtaining multiple outputs from a switching device, comprising applying an input to an arrangement of macrocyclic molecules in at least one of a substantially one dimensional stack-like or ring-like structure or a substantially two dimensional sheet-like structure, and responding to multiple outputs, wherein said applying an input to an arrangement of macrocyclic molecules in a substantially two dimensional sheet-like structure comprises applying the input to a substantially two dimensional sheet-like structure of fused macrocyclic molecules.

16. A method of making a quantum electro-optical device, comprising arranging a plurality of macrocyclic molecules in a substantially one dimensional ring-like stack or in a substantially two dimensional sheet-like arrangement, and adsorbing the same to a conductor or semiconductor substrate, wherein said arranging comprises arranging a plurality of macrocyclic molecules in a substantially two dimensional sheet-like arrangement of fused macrocyclic molecules.

* * * * *

UNITED STATES PATENT AND TRADEMARK OFFICE
CERTIFICATE OF CORRECTION

PATENT NO. : 6,937,379 B2
DATED : August 30, 2005
INVENTOR(S) : Simic-Glavaski

It is certified that error appears in the above-identified patent and that said Letters Patent is hereby corrected as shown below:

Column 2,
Line 39, replace "10^(-5)" with -- 10^(-15) --.

Column 6,
Line 63, replace "calumel a electrode" with -- calumel electrode --.

Column 10,
Line 27, replace "I" with -- 1 --.

Column 11,
Line 4, replace "molecule" with -- molecules --.
Line 19, replace "phthaiocyanine" with -- phthaocyanine --.
Line 26, replace "phlthaiocyanine" with -- phthaocyanine --.
Line 29, replace "bathting" with -- bathing --.

Column 12,
Line 5, replace "10^(-3) may" with -- 10^(-3), may --.
Line 14, replace "I" with -- 1 --.

Column 15,
Line 11, replace "the 30 curved" with -- the curved --.

Column 21,
Line 37, replace "Hydogen" with -- Hydrogen --.
Line 51, replace "dinensional" with -- dimensional --.
Line 52, replace "ring-fuised" with -- ring-fused --.

UNITED STATES PATENT AND TRADEMARK OFFICE
CERTIFICATE OF CORRECTION

PATENT NO. : 6,937,379 B2
DATED : August 30, 2005
INVENTOR(S) : Simic-Glavaski

It is certified that error appears in the above-identified patent and that said Letters Patent is hereby corrected as shown below:

Column 23,
Line 19, replace "chiorophyls" with -- chlorophyls --.
Line 43, replace "Q" bit" with -- $Q^{(u)}$ bit --.

Column 24,
Line 57, replace "guantum" with -- quantum --.

Signed and Sealed this

Fifteenth Day of November, 2005

JON W. DUDAS
*Director of the United States Patent and Trademark Office*